(12) United States Patent
Sreetharan et al.

(10) Patent No.: US 10,349,543 B2
(45) Date of Patent: Jul. 9, 2019

(54) LAYERED ASSEMBLIES

(71) Applicants: Pratheev Sabaratnam Sreetharan, Cambridge, MA (US); Andrew Baisch, Cambridge, MA (US)

(72) Inventors: Pratheev Sabaratnam Sreetharan, Cambridge, MA (US); Andrew Baisch, Cambridge, MA (US)

(73) Assignee: Vibrant Composites Inc., Cambridge, MA (US)

( * ) Notice: Subject to any disclaimer, the term of this patent is extended or adjusted under 35 U.S.C. 154(b) by 0 days.

(21) Appl. No.: 14/834,336

(22) Filed: Aug. 24, 2015

(65) Prior Publication Data

US 2015/0366113 A1    Dec. 17, 2015

Related U.S. Application Data

(63) Continuation-in-part of application No. PCT/US2014/018096, filed on Feb. 24, 2014.

(60) Provisional application No. 61/768,397, filed on Feb. 22, 2013, provisional application No. 61/768,494, filed on Feb. 24, 2013, provisional application No. 61/771,847, filed on Mar. 2, 2013, provisional application No. 61/772,239, filed on Mar. 4, 2013, provisional application No. 61/772,257, filed on Mar. 4, 2013, provisional application No. 61/775,852, filed on Mar. 11, 2013, provisional application No. 61/775,867, filed on Mar. 11, 2013, provisional application No. 61/788,698, filed on Mar. 15, 2013, provisional application No. 61/821,495, filed on May
(Continued)

(51) Int. Cl.
*H05K 5/02* (2006.01)
*E05D 1/00* (2006.01)
*E05D 1/02* (2006.01)
*E05D 11/00* (2006.01)

(52) U.S. Cl.
CPC .............. *H05K 5/0226* (2013.01); *E05D 1/00* (2013.01); *E05D 1/02* (2013.01); *E05D 11/0081* (2013.01); *Y10T 16/525* (2015.01); *Y10T 29/49004* (2015.01)

(58) Field of Classification Search
CPC .... H05K 13/0023; H05K 5/0226; E05D 1/00; E05D 1/02; E05D 11/0081; Y10T 16/525; Y10T 16/522; Y10T 16/555; Y10T 16/558; Y10T 29/49004; B81B 5/00
USPC ............. 16/225, 223, 385, 387; 361/679.27; 29/593
See application file for complete search history.

(56) References Cited

U.S. PATENT DOCUMENTS 4,732,060 A   3/1988  Yamamoto et al.
6,007,309 A  12/1999  Hartley
(Continued)

FOREIGN PATENT DOCUMENTS

WO   WO 2012/109559 A1   8/2012
WO   WO 2015/123361 A1   8/2015

OTHER PUBLICATIONS http://www.rivtec.co.nz/hardware/TILA-hinge/59-tila-continuous-hinge, TILA Continuous Hinge; 2012 RIVTEC LTD.

*Primary Examiner* — William L Miller
(74) *Attorney, Agent, or Firm* — Bergman LLC; Michael Bergman

(57) ABSTRACT

An assembly structure is formed of generally rigid layers of material bonded to generally flexible layers so as to form apparatus including hinges, bearings, and other translating and rotating subunits along with embedded functional devices.

18 Claims, 28 Drawing Sheets

Related U.S. Application Data 9, 2013, provisional application No. 61/933,037, filed on Jan. 29, 2014, provisional application No. 61/933,027, filed on Jan. 29, 2014, provisional application No. 62/051,355, filed on Sep. 17, 2014.

(56) References Cited

U.S. PATENT DOCUMENTS

| | | | |
|---|---|---|---|
| 6,543,087 B2* | 4/2003 | Yeh | B81B 3/0062 16/292 |
| 6,950,620 B2 | 6/2005 | Silverbrook | |
| 7,085,122 B2* | 8/2006 | Wu | H01G 5/06 333/134 |
| 7,523,546 B2 | 4/2009 | Vatanparast et al. | |
| 9,140,042 B2* | 9/2015 | Erlich | B81C 1/00523 |
| 9,482,863 B2* | 11/2016 | Erlich | G02B 26/085 |
| 2002/0168144 A1 | 11/2002 | Chen et al. | |
| 2003/0129064 A1 | 7/2003 | Cabuz et al. | |
| 2003/0231967 A1 | 12/2003 | Najafi et al. | |
| 2004/0007970 A1 | 1/2004 | Ma et al. | |
| 2004/0055151 A1 | 3/2004 | Obi et al. | |
| 2004/0145277 A1 | 7/2004 | Horning et al. | |
| 2007/0013052 A1 | 1/2007 | Zhe et al. | |
| 2008/0093424 A1 | 4/2008 | Kumar et al. | |
| 2009/0160770 A1 | 6/2009 | Shahoian | |
| 2009/0213450 A1 | 8/2009 | Sampsell | |
| 2011/0032624 A1 | 2/2011 | Bolis et al. | |
| 2011/0043937 A1 | 2/2011 | Juncker et al. | |
| 2011/0186943 A1 | 8/2011 | Pahl et al. | |
| 2012/0217031 A1 | 8/2012 | Stalford | |
| 2012/0292438 A1* | 11/2012 | Sreetharan | B64C 33/02 244/72 |
| 2013/0021087 A1 | 1/2013 | Rosset et al. | |
| 2013/0114148 A1 | 5/2013 | Aschwanden et al. | |
| 2014/0002248 A1 | 1/2014 | Zawacki et al. | |
| 2014/0002249 A1 | 1/2014 | Lim et al. | |
| 2014/0009005 A1 | 1/2014 | Irwin | |
| 2014/0202628 A1* | 7/2014 | Sreetharan | H01L 41/25 156/257 |
| 2014/0310914 A1* | 10/2014 | Erlich | B81C 1/00523 16/225 |
| 2017/0152887 A1* | 6/2017 | Erlich | F16C 11/12 |

* cited by examiner

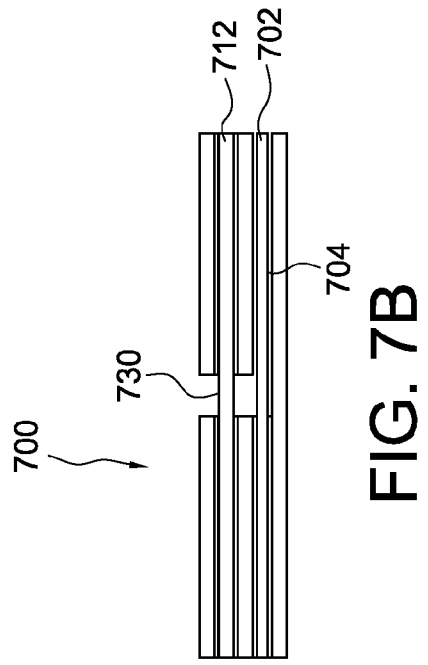
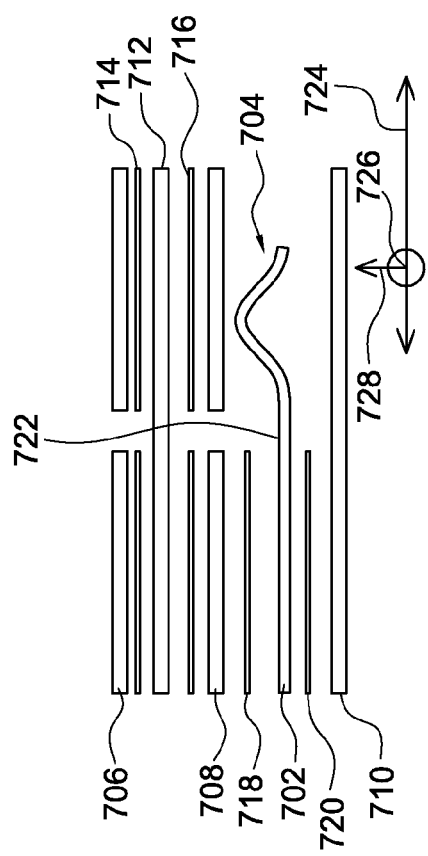
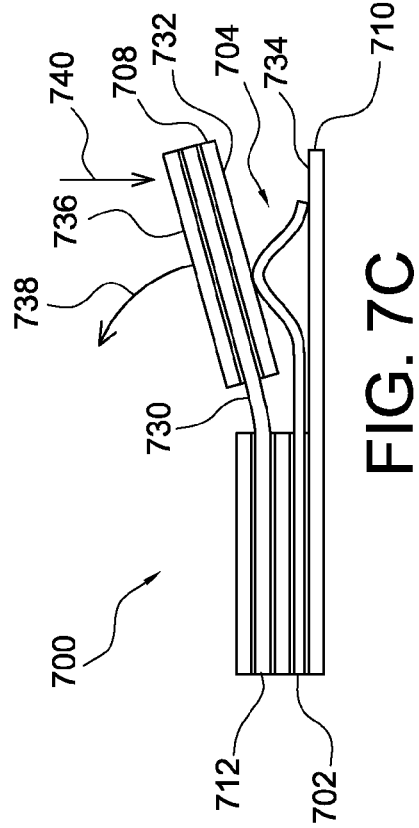

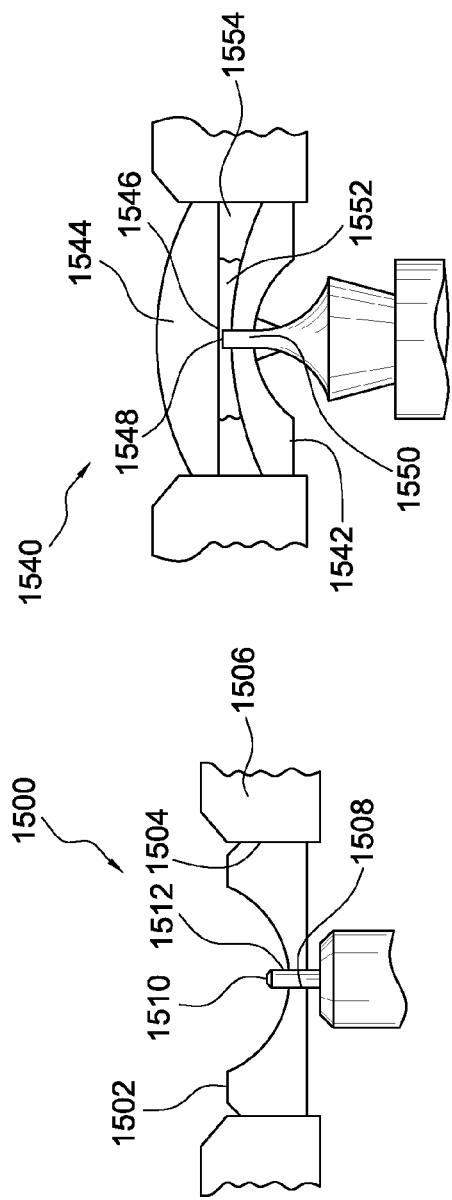
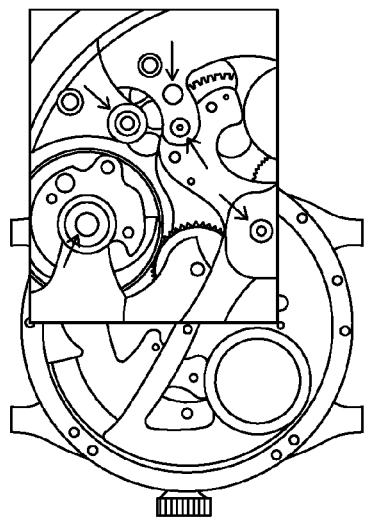
FIG. 15A
FIG. 15B
FIG. 15C

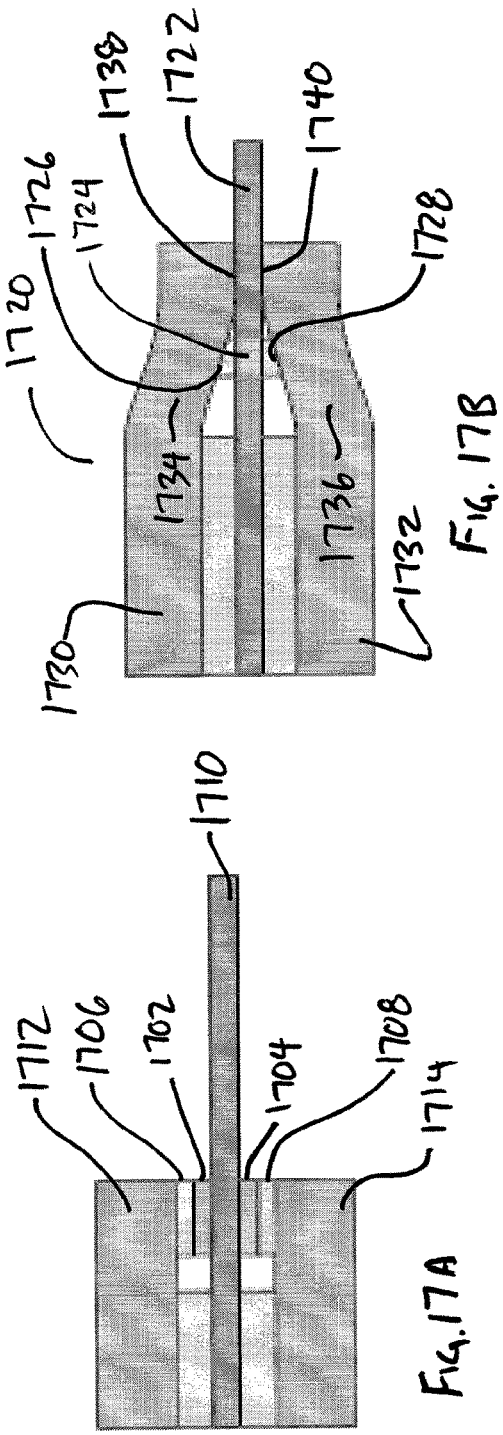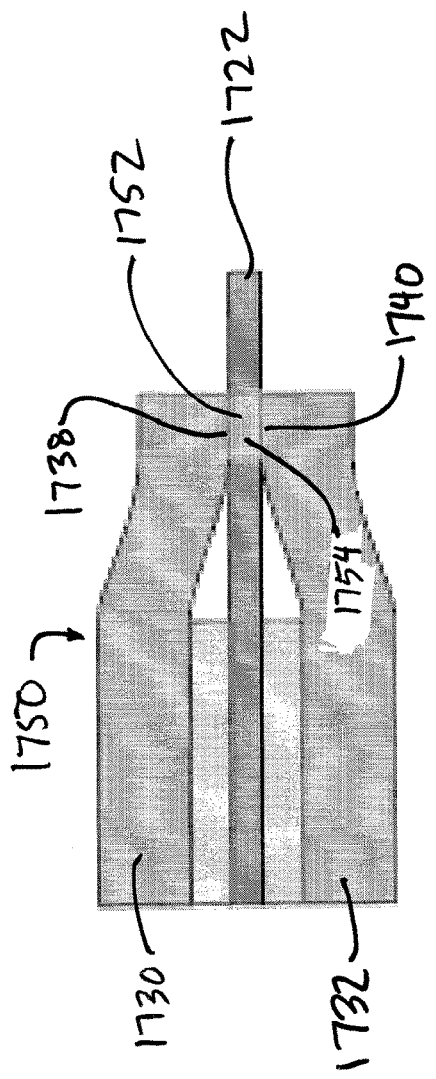
FIG. 17A
FIG. 17B
FIG. 17C

LAYERED ASSEMBLIES

CROSS-REFERENCE TO RELATED APPLICATIONS

The present application is a continuation-in-part of PCT patent application number PCT/US 2014/014/018096, filed on Feb. 24, 2014, the disclosure of which is herewith incorporated by reference in its entirety, which in turn claims the benefit of U.S. provisional patent application No. 61/768,397 filed on Feb. 22, 2013; and of U.S. provisional patent application No. 61/768,494 filed on Feb. 24, 2013; and of U.S. provisional patent application No. 61/771,847 filed on Mar. 2, 2013; and of U.S. provisional patent application No. 61/772,239 filed on Mar. 4, 2013; and of U.S. provisional patent application No. 61/772,257 filed on Mar. 4, 2013; and of U.S. provisional patent application No. 61/775,852 filed on Mar. 11, 2013; and of U.S. provisional patent application No. 61/775,867 filed on Mar. 11, 2013; and of U.S. provisional patent application No. 61/788,698 filed on Mar. 15, 2013; and of U.S. provisional patent application No. 61/821,495 filed on May 9, 2013. The disclosures of all of the foregoing applications are incorporated by reference herewith in their entireties. The present application further claims the benefit of U.S. provisional patent application No. 62/051,355 filed Sep. 17, 2014 and entitled "Joint Topology" the disclosure of which is further herewith incorporated by reference in its entirety.

FIELD OF THE INVENTION

The present invention relates features of a manufactured assembly and more particularly to assembly features of a manufactured laminated assembly.

BACKGROUND

The ability to manufacture goods efficiently and with superior functionality has long been a key determinant of economic success for individuals, enterprises and societies. Contrary to popular perception, most innovation takes place through an evolutionary process in which pre-existing elements are recombined in surprisingly useful ways, rather than as a radical departure from the status quo. This is true of innovations in apparatus and methods and also in manufacturing techniques.

The history of manufactured goods spans a long series of transitions across materials (from wood, stone and leather to gold, copper, bronze, iron and steel and on to various synthetic materials including among others man-made polymers. Likewise, the techniques of manufacturing have evolved from the preparation of individual items through the development of interchangeable parts, moving assembly lines and various photolithographic techniques for the preparation of circuit boards, integrated circuits and micro-electromechanical (MEMS) systems.

MEMS systems predominate among mechanical devices at the micron scale and typically involve the bulk addition and removal of materials in serial fashion from a single substantially planar substrate. Traditional machining and fabrication practices are readily applicable to devices from centimeter scale up to meters (e.g. large machine tools and dynamos).

While these developments have led to a remarkable abundance and variety of products, one that would astound the most prescient individual of a century ago, there remain apparatus and systems that are persistently difficult, time-consuming and consequently expensive to manufacture. In particular, manufacturing at the millimeter scale, remains challenging for a variety of reasons.

SUMMARY

Having examined and understood a range of previously available devices, the inventor of the present invention has developed a new and important understanding of the problems associated with the prior art and, out of this novel understanding, has developed new and useful solutions and improved devices, including solutions and devices yielding surprising and beneficial results.

Certain exemplary structures, prepared according to principles of the invention, will include laminated structures created from substantially flat source layers of material. Three-dimensional assemblies are formed through subtractive machining and additive lamination of these flat layers. Such a methodology creates two and a half dimensional structures built from the layers. In addition, certain three-dimensional structures will be added to the assembly for their beneficial effect.

The invention encompassing these new and useful solutions and improved devices is described below in its various aspects with reference to several exemplary embodiments including a preferred embodiment.

These and other advantages and features of the invention will be more readily understood in relation to the following detailed description of the invention, which is provided in conjunction with the accompanying drawings. It should be noted that, while the various figures of the following drawings show respective aspects of the invention, no one figure is intended to show the entire invention. Rather, the figures together illustrate the invention in its various aspects and principles. As such, it should not be presumed that any particular figure is exclusively related to a discrete aspect or species of the invention. To the contrary, one of skill in the art will appreciate that the figures taken together reflect various embodiments exemplifying the invention.

Correspondingly, referenced throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

BRIEF DESCRIPTION OF THE DRAWINGS

FIG. 7A shows, in exploded schematic side view, a portion of an assembly including an elastic portion prepared according to principles of the invention;

FIG. 7B shows, in schematic side view, a portion of an assembly including a deformed elastic portion prepared according to principles of the invention;

FIG. 7C shows, in schematic side view, a portion of an assembly including a relaxed elastic portion prepared according to principles of the invention;

FIG. 15A shows, in schematic side view, a portion of a bearing device for use in an assembly prepared according to principles of the invention;

FIG. 15B shows, in schematic side view, a portion of a further bearing device for use in an assembly prepared according to principles of the invention;

FIG. 15C shows, in photographic top view, a portion of a mechanical device including a bearing device exemplary of a device that can be used an assembly prepared according to principles of the invention;

FIG. 17A shows, in schematic side view, a portion of a laminated assembly including a further clamped hinge feature prepared according to principles of the invention;

FIG. 17B shows, in schematic side view, a portion of a laminated assembly including a still further clamped hinge feature prepared according to principles of the invention;

FIG. 17C shows, in schematic side view, a portion of a laminated assembly including yet another clamped hinge feature prepared according to principles of the invention;

DETAILED DESCRIPTION

The following description is provided to enable any person skilled in the art to make and use the disclosed inventions and sets forth the best modes presently contemplated by the inventor of carrying out his inventions. For purposes of explanation, numerous specific details are set forth in order to provide a thorough understanding of the present invention. It will be apparent, however, to one skilled in the art that the invention may be practiced without these specific details. In certain instances, well-known structures and devices are shown in block diagram form in order to avoid unnecessarily obscuring the substance disclosed.

It is in the context of these difficulties, well-known and of long standing in the art, that the present inventor has come to recognize a fundamental opportunity with surprising and beneficial ramifications. The methods described herein are extremely versatile with respect to the materials that can be used. For example, traditional MEMS are largely limited to bulk addition of materials, whereas the methods described herein can be used not only to add precisely patterned layers, but also full sub-components, such as integrated circuits, flex circuits, actuators, batteries, etc. The thermal requirements of the multi-layer, super-planar structures described herein can also be much lower, and the fabrication-equipment costs can be much lower, as well. Further still, processing steps in these methods on the various layers can be performed simultaneously and parallel, allowing important scalability of the manufacturing process.

The present invention includes a complement of methods and apparatus that together form and identify a novel set of interoperable components and sub-assemblies. This set of components and subassemblies, applied alone, in combination, and together with additional elements, enable the preparation of mechanical and electromechanical devices with a consistency of characteristics, customizability and manufacturing scalabity that would otherwise be difficult or impossible to achieve.

In its various aspects and embodiments, the invention includes components, subassemblies and assemblies that incorporate laminated combinations of generally planar materials. Among other notable features, the invention includes members having certain structural characteristics in one or more dimensions and referred to as "tendons" or "cable drives," and features having various characteristics and configurations arranged to support a relative rotary motion between two elements around at least one axis and referred to as "hinges" or "joints." Among these, are included a variety of "torsion joints" as exemplified herewithin. Also included are "rivets" and riveted features, "embedded circuits and devices" and "3-D layers" that deform, upon relaxation or under applied force, to assume a non-planar aspect.

Taken together, these methods, apparatus and systems are referred to as Micro Multilayer Etched Composite Systems™ (μMECS™).

Figure 1:
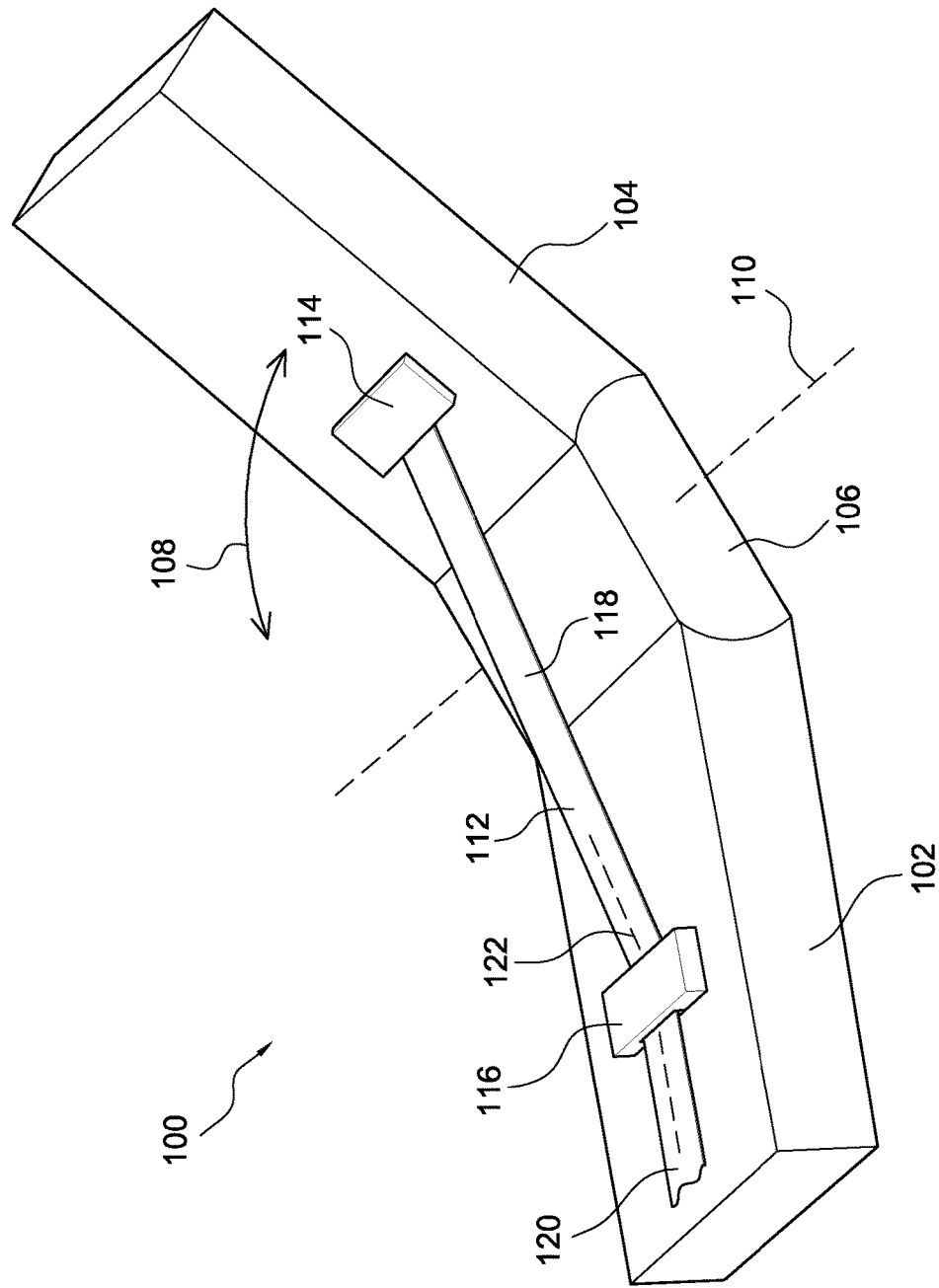
FIG. 1 shows, in schematic perspective view, a portion of a laminated assembly including a tendon feature prepared according to principles of the invention.

In light of the foregoing, FIG. 1 shows, in schematic perspective view, a portion of a joint assembly 100 prepared according to principles of the invention. The illustrated joint assembly 100 includes a first substantially rigid portion 102 mutually coupled to a second substantially rigid portion 104 by an intervening joint element 106. The joint element 106 permits a rotary motion 108 of portion 104 with respect to portion 102 about a longitudinal axis 110 of the joint element.

A tendon member 112 is substantially fixedly coupled at a first end region thereof to portion 104 by an anchor feature 114. The tendon member 112 is slidingly coupled to portion 102 at a further region by a guide feature 116 such that a variable length 118 of tendon member 112 is disposed between the anchor feature 114 and a guide feature 116. A further length 120 of tendon member 112 extends outward beyond the guide feature 116.

The tendon member 112 serves to transmit mechanical force to and across the joint. The tendon can take many forms but is typically compliant in bending and constructed of a material that can slide through a respective tendon guide feature 116 with low friction. Accordingly, in certain embodiments, a tendon will be relatively inelastic along a longitudinal axis 122 while being relatively flexible across axis 122.

In alternative embodiments, a tendon may exhibit desirable longitudinal elasticity along axis 122. In certain applications, such longitudinal elasticity will serve to absorb shock that might otherwise be damaging to other features of the joint or apparatus in general.

Figure 2:
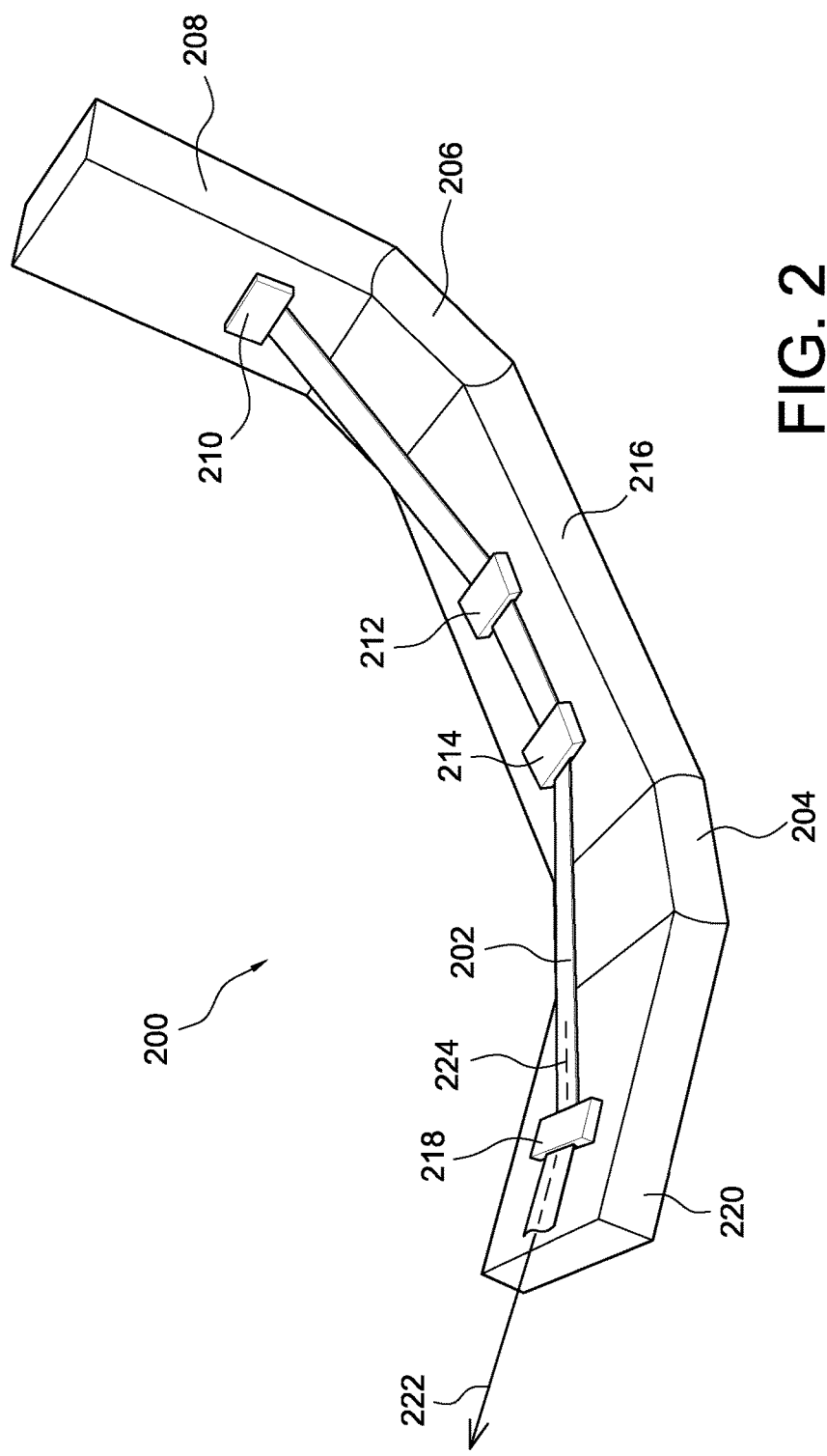
FIG. 2 shows, in schematic perspective view, a portion of a further laminated assembly including a tendon feature.

FIG. 2 shows a further embodiment 200 in which a unitary tendon 202 spans a plurality of joint elements e.g., 204, 206 so as to operate more than one joint at once. In a fashion similar to that of joint assembly 100, tendon 202 is anchored to a first substantially rigid member 208 by an anchor feature 210 at or near one end of the tendon.

The tendon passes slidingly through one or more joint guide features e.g., 212, 214 coupled to a second substantially rigid member 216, and through a further joint guide feature 218 coupled to still another substantially rigid member 220. The application of a tensile force 222 along a longitudinal axis 224 of the tendon actuates the assembly to produce a rotation of the substantially rigid members about the joint elements.

Figure 3:
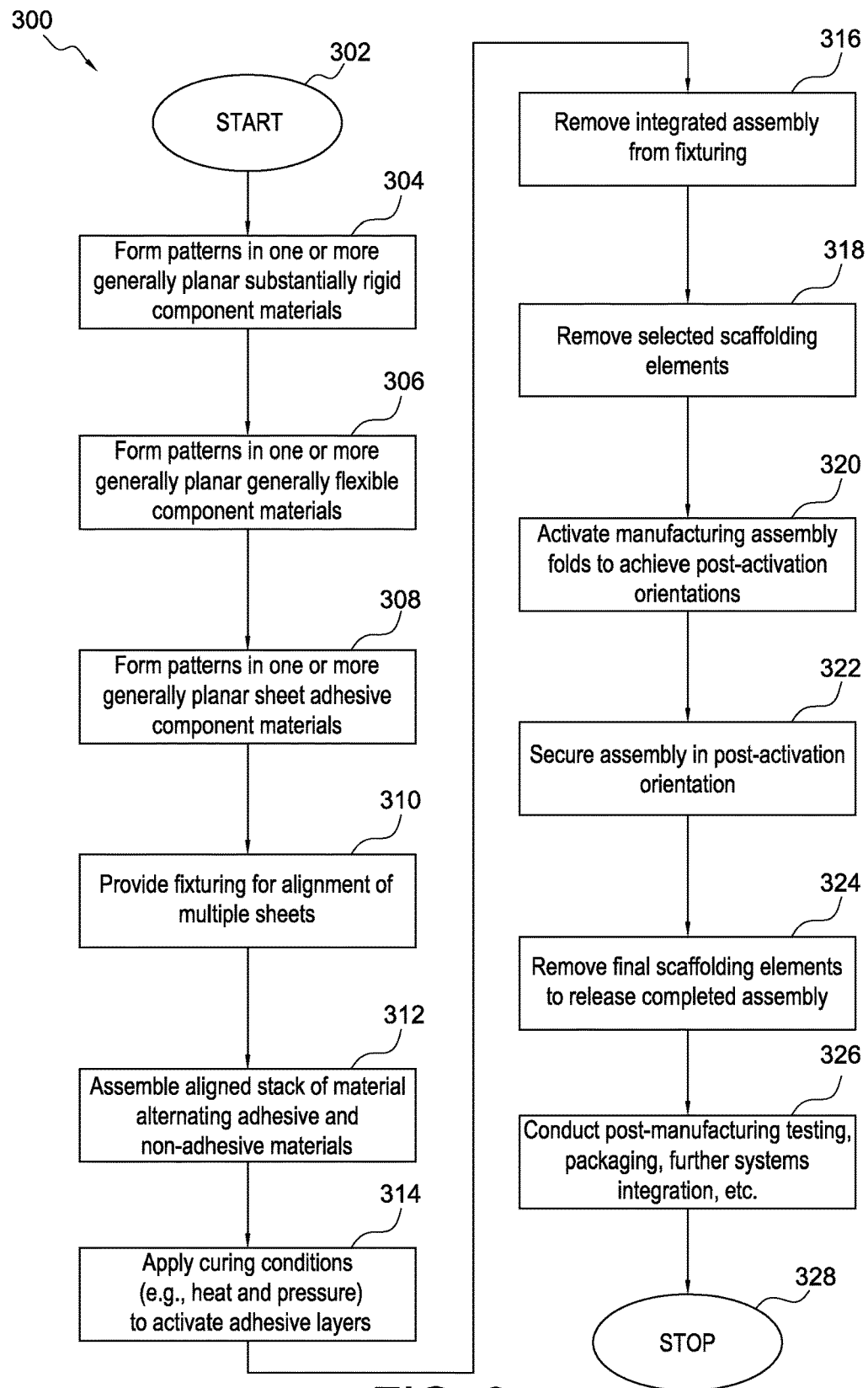
FIG. 3 shows, in the form of a linear flowchart, a portion of a method for preparing a laminated assembly according to principles of the invention.

A μMECS™ tendon, as illustrated and described in relation to FIGS. 1 and 2, can be prepared according to a manufacturing process like that illustrated schematically in FIG. 3. FIG. 3 shows a block diagram corresponding to the steps of a manufacturing process 300. Beginning at step 302, the process involves forming a pattern in one or more generally planar sheets of a more or less rigid material 304. In a typical application, at least one of the sheets will be substantially rigid. In certain applications, the generally rigid material may have an anisotropic characteristic such that it is more or less rigid along one axis than along another.

In various applications, the sheet will include a material such as, for example, fiberglass reinforced polyester, carbon reinforced polyester, or any other filled or reinforced polymer material. Alternately or in combination, the generally rigid material may include a metallic material such any appropriate metal or metallic alloy. The forming of a pattern in such a sheet of material will include, in certain exemplary applications, the removal of material by photolithographic etching, the removal of material by laser machining, patterning of the material by the application of a die and/or the removal of material by the application of a cutting tool. In addition, additive processes may be used in forming the patterned sheet.

As noted, at step 304, a pattern is formed in one or more sheets of a generally planar flexible component material. In various applications, the generally flexible material may be substantially flexible. In certain applications, the flexible material may have an anisotropic characteristic such that it is more or less flexible along one axis than along another. Patterning of the generally flexible material will proceed in any manner appropriate to the material including, among others, any of the processes identified above with respect to the rigid material.

At step 306, a pattern is formed in one or more sheets of an adhesive component material. In various cases, the adhesive material may be substantially flexible. In other cases, the adhesive material will be substantially rigid. In certain cases, the adhesive material may have an anisotropic characteristic such that it is more or less flexible or rigid along one axis than along another. Patterning of the adhesive material will proceed in any manner appropriate to the adhesive material including, among others, any of the processes identified above with respect to the rigid and flexible materials.

As indicated at step 310, fixturing apparatus is provided for alignment of the various sheets of rigid, flexible and adhesive material prepared in steps 304-308. In certain abundance, the fixturing apparatus will include alignment pins such as are known in the art. In other embodiments the fixturing apparatus will include active alignment actuators and/or optical alignment devices.

As indicated in step 312, an assembly is thereafter prepared by applying the previously prepared and patterned (and in some cases unpatterned sheets of material) to the fixturing apparatus. It will be appreciated that the patterns and materials will, in certain embodiments, differ from sheet to sheet according to the requirements of a particular application. Moreover, in certain cases, one or more sheets of adhesive material may be omitted in favor of applying adhesive individual sheets and/or surface regions. The adhesive material will be applied, in any manner that is no more becomes known in the art. By way of example only, the adhesive material may be applied in liquid, powder, aerosol or gaseous form as individual sheets are added to the assembly.

As will be understood by one of ordinary skill in the art in light of the totality of the current presentation, the characteristics of the various layers and patterns will be chosen and applied according to the requirements of a particular assembly being prepared. Thus, for example, where a joint feature is required, a prepared void in substantially rigid sheets above and below a flexible layer will leave a portion of an intervening flexible layer exposed and ultimately able to flexibly support the adjacent more rigid materials.

As indicated in step 314, curing conditions are then applied to the assembled materials and/or fixturing apparatus. In certain embodiments, the curing conditions will include the application of heat and/or pressure to the assembly of layers. In other embodiments, the curing conditions will include the application of physical or chemical additives such as, for example, catalytic chemicals, reduce temperatures, gaseous chemical components, or any other condition appropriate to secure a desirable unification of the various layers into an integrated assembly.

As per step 316, the integrated assembly is, in certain embodiments, then removed from the fixturing apparatus. In some embodiments the integrated assembly is transferred thereafter to additional fixturing equipment. In other embodiments, and as will be understood by one of skill in the art, the integrated assembly remains on the fixturing apparatus for further processing.

In step 318, a method according to certain embodiments of the invention will include the removal of certain portions of one or more of the rigid and/or flexible layers. These portions will have served to support particular regions of the corresponding layer during the preceding processing steps. Their removal will allow one or more of those portions to translate, rotate, or otherwise reorient with respect to some additional portion of the assembly. This step may include the removal of individual assemblies from a larger sheet/assembly on which multiple assemblies of similar or different configurations have been prepared.

In certain embodiments, the removal of particular support regions will be effected by laser machining. In various other embodiments, the removal of support regions will be effected by mechanical machining, wet chemical etching, chemical vapor etching, scribing, cutting, die cutting, punching, and/or tearing, among others. One of skill in the art will appreciate that any combination of these methods (or other methods that are known or become known in the art) will be beneficially applied and will fall within the scope of the invention.

Once the removal of identified portions of the one or more rigid and/or flexible layers is complete, the assembly is activated, as per step 320 to transition from its existing status to a post-activation configuration. This activation will, in certain embodiments, including reorientation of certain portions of one or more regions of one or more of the sheets of material. Thus, for example, in certain embodiments, a portion of the assembly will fold up out of its initial plane to form a three-dimensional assembly in the manner of a pop-up book.

The activation will incorporate various motions in corresponding embodiments of the invention including various translations and rotations along and about one or more axes. In respective embodiments, the activation will be effected by active fixturing apparatus, by the action of an individual worker, by a robotic device, by a device integrated within the assembly itself such as, for example, a spring, a motor, a piezoelectric actuator, a bimetal/bimorph device, a magnetic actuator, electromagnetic actuator, a thermal expansive or contractive device, chemical reaction including, for example, a gas generating process, the crystallization process, a dehydration process, a polymerization process, or any other processor device appropriate to the requirements of a particular application.

In certain embodiments, and as indicated at step 322, a further process step will secure the apparatus in its activated configuration. Among other methods that will be evident to one of skill in the art in light of the present disclosure, this step of securing the apparatus in its activated configuration will include, in certain embodiments, point soldering, wave soldering, tip soldering, wire bonding, electrical welding, laser welding, ultrasonic welding, thermal bonding, chemical adhesive bonding, the activation of a ratchet and pawl device, the activation of a helical unidirectional gripping device, the application of a snap, a hook and loop fastener, a rivet, or any other fastener or fastening method that is known or becomes known to those of skill in the art.

Of course it will be understood by the reader that in certain embodiments, the process or mechanism that reorients the apparatus into its activated configuration will serve to maintain that configuration without any additional step 322 process or action. Moreover, while the securing indicated at step 322 is generally anticipated to be permanent, in certain applications it will be beneficially temporary and/or repeatable.

At step 324 additional scaffolding elements will be removed or severed to release the activated and secured from any remaining scaffolding. One of skill in the art will appreciate that this step will be unnecessary where the device was completely released from any associated scaffolding prior to activation. Moreover, in other embodiments and applications the activated device will remain coupled to surrounding scaffolding for additional processing steps. To the extent that step 324 is applied any of the approaches and methodologies identified above at, for example, step 318 will be advantageously applied according to the instant circumstances.

Thereafter, again depending on the requirements of a particular apparatus or embodiment, various testing, packaging, systems integration and other manufacturing or application steps will be applied as indicated in step 326 after which the operation concludes with step 328.

Figure 4A:
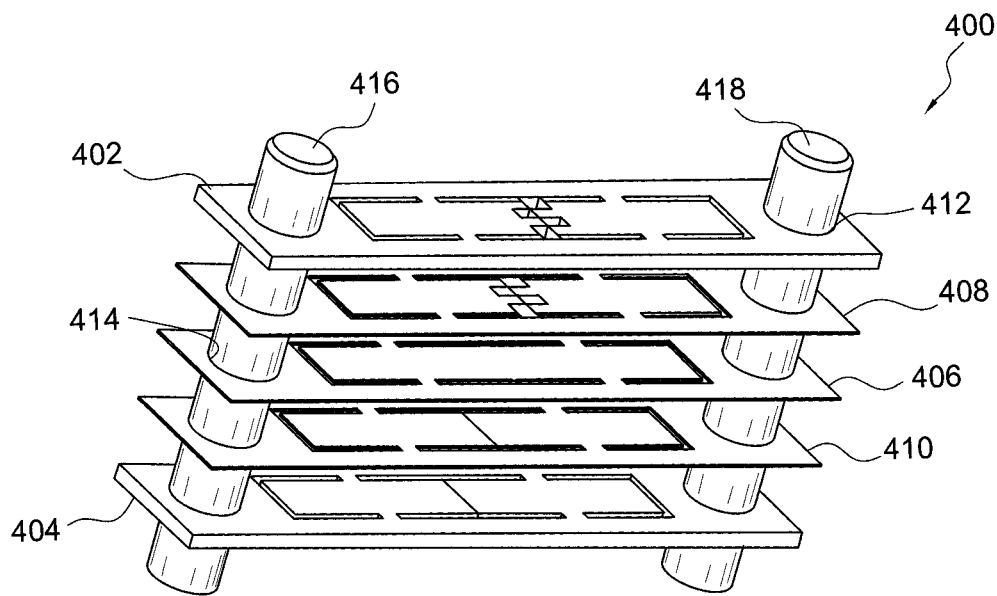
FIG. 4A shows, in exploded schematic perspective view, a laminated assembly prepared according to principles of the invention.

FIG. 4A shows certain elements 400 of an assembly consisted with, for example, process 300. The elements include a first patterned substantially rigid layer 402, a second patterned substantially rigid layer 404, a patterned substantially flexible layer 406, and first 408 and second 410 patterned adhesive layers.

As shown, the pattern of each exemplary layer includes apertures, e.g., 412, 414 for receiving corresponding fixturing pins or dowels, e.g., 416, 418. These fixturing dowels serve to maintain a desirable alignment of the various patterns while the assembly is compressed and curing of the adhesive layers 408, 410 is accomplished.

Figure 4B:
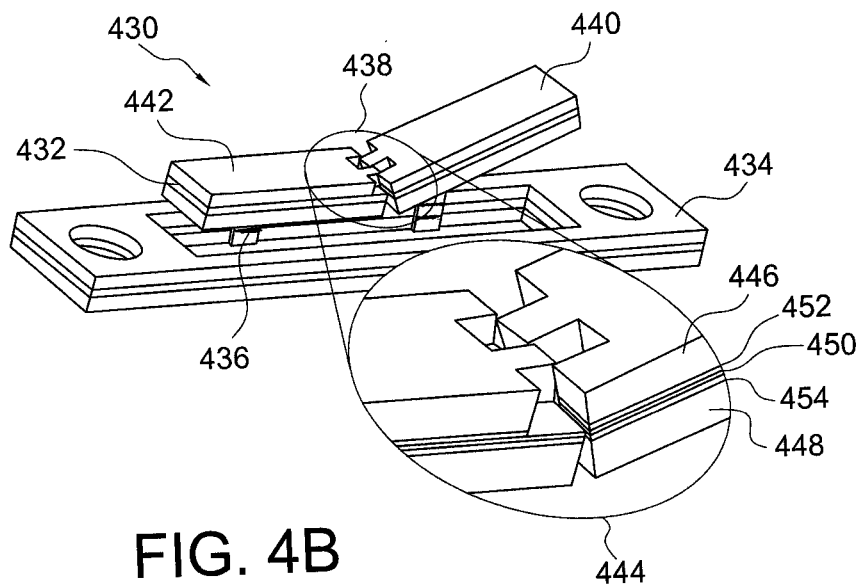
FIG. 4B shows, in schematic perspective view, a portion of a laminated assembly prepared according to principles of the invention.

The result, as shown 430 in FIG. 4B is an exemplary hinged assembly 432 that has been released from a surrounding scaffolding material 434 by the severing of various support regions, e.g., 436. As is readily apparent the released assembly includes a hinge feature 438 coupled between first 440 and second 442 substantially rigid members. As further shown in the magnified portion region 444, each substantially rigid member includes an upper rigid portion 446 and a lower rigid portion 448 coupled to respective sides of the flexible portion 450 by respective layers of cured, or otherwise activated, adhesive material 452, 454. It will be further appreciated that, while no securing step is apparent in relation to the hinged assembly 432, other assemblies will benefit from such further processing.

Figure 5:
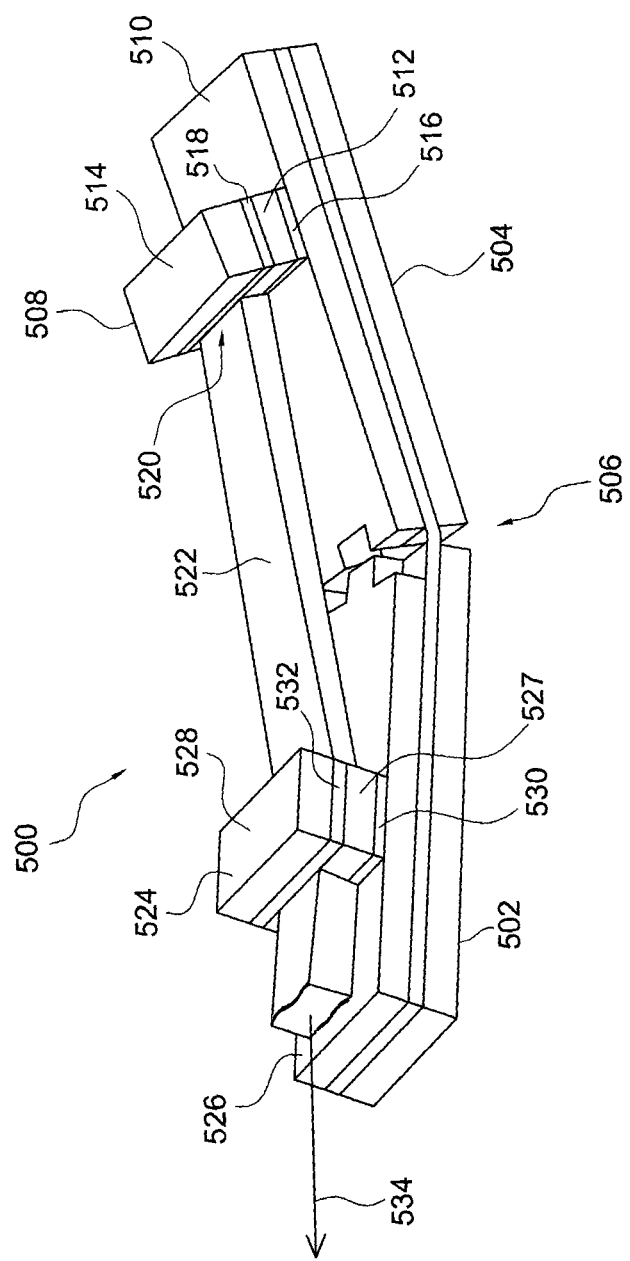
FIG. 5 shows, in schematic perspective view, further aspects of a laminated assembly prepared according to principles of the invention.

Referring again to FIG. 1, and FIG. 4B, and in the context of the further disclosure above, it will be apparent to one of skill in the art that, for example, a hinged assembly 432 can be prepared including an anchor feature 114 and a guide feature 116 along with a tendon member 112. Reference is made, for example, to FIG. 5.

FIG. 5 shows, in schematic perspective view, a further hinged assembly 500 including a first substantially rigid member 502 and a second substantially rigid member 504 mutually coupled to one another by a hinge feature 506. An anchor feature 508 is coupled to an upper surface region 510 of substantially rigid member 504.

The anchor feature is formed to include portions 512, 514 of respective further substantially rigid layers. Portion 512 is substantially fixedly coupled to upper surface 510 by a portion 516 of a further adhesive layer. Portion 514 is coupled to portion 516 by a portion 518 yet another adhesive layer.

Respective upper and lower surface regions at a distal end 520 of a tendon member 522 are substantially fixedly coupled to corresponding regions of adhesive layers 518 and 516 and thereby fixed to substantially rigid member 510 in the vicinity of anchor feature 508.

Similarly, a tendon guide feature 524 is coupled to an upper surface region 526 of rigid member 502. The attendant guide feature 524 includes substantially rigid portion 527 forms of the same material layer as portion 512. Likewise, portion 528 of tendon guide feature 524 is formed of the same substantially rigid layer as portion 514 of the anchor feature 508.

Adhesive layer portion 530 is formed of the same layer as portion 516 and couples portion 527 to surface region 526. Likewise, adhesive layer portion 532 is formed of the same adhesive layer as portion 518, and substantially fixedly couples rigid portion 528 to rigid portion 527. Finally, it should be noted, that the adhesive layers forming portions 530 and 532 are pattern so as to avoid any bonding between tendon member 522 and adjacent surface regions of the tendon guide feature 524 and/or surface region 526.

In the illustrated embodiment, tendon member 522 includes a substantially inelastic, substantially flexible material with surface characteristics that allow it to slide with minimal friction across surface region 526 and the internal surface regions of tendon guide feature 524. Consequently, the application of a tensile force 534 to a proximal region of the tendon member 522 causes rigid member 504 to rotate with respect to rigid member 502 about the hinge feature 506.

Tendons can be patterned from full sheets of materials including polyimide films and steel, or can be inserted into μMECS™ layups as discrete fibers or fiber bundles of aramid or other material. This invention fundamentally enables a new class of tendon-driven mechanisms that includes robust and complex prosthetic limbs The above-described tendon stands in contrast to an alternative arrangement in which a rigid or nearly rigid mechanical structure is employed as a linkage. The link is generally includes a substantially rigid member disposed between opposite sides of a hinge or joint with localized flexible portion that respective ends of the rigid mechanical structure.

One use for μMECS™ tendons is in conjunction with more conventional linkage structures. These tendons allow mapping complex actuator strokes to similarly complex mechanical linkage kinematics in a simple, robust fashion. Generally operated in tension, a tendon prepared according to principles of the invention offer, among other benefits, the advantages of simple power transmission from a proximal actuator to a distal end effector through extremely complex geometries with minimal increases in mechanical footprint, mass, and complexity.

In certain embodiments, the tendon member 522 will include an insulating material such as, for example, polyimide or polyester (sold commercially, for example as Mylar™). In other embodiments, the tendon member 522 will be formed of a conductive material such as, for example a metallic material. In still further embodiments, the tendon member 522 will include both insulating and conductive materials and, in certain embodiments, will include patterned conductors in the form of a flexible printed circuit. Similarly, other flexible and rigid members within an assembly according to the invention can include flexible conductors formed using the known methods of printed circuit technology. Such conductors can be employed to convey signals and power to and from devices embedded within the assembly.

Figure 6:
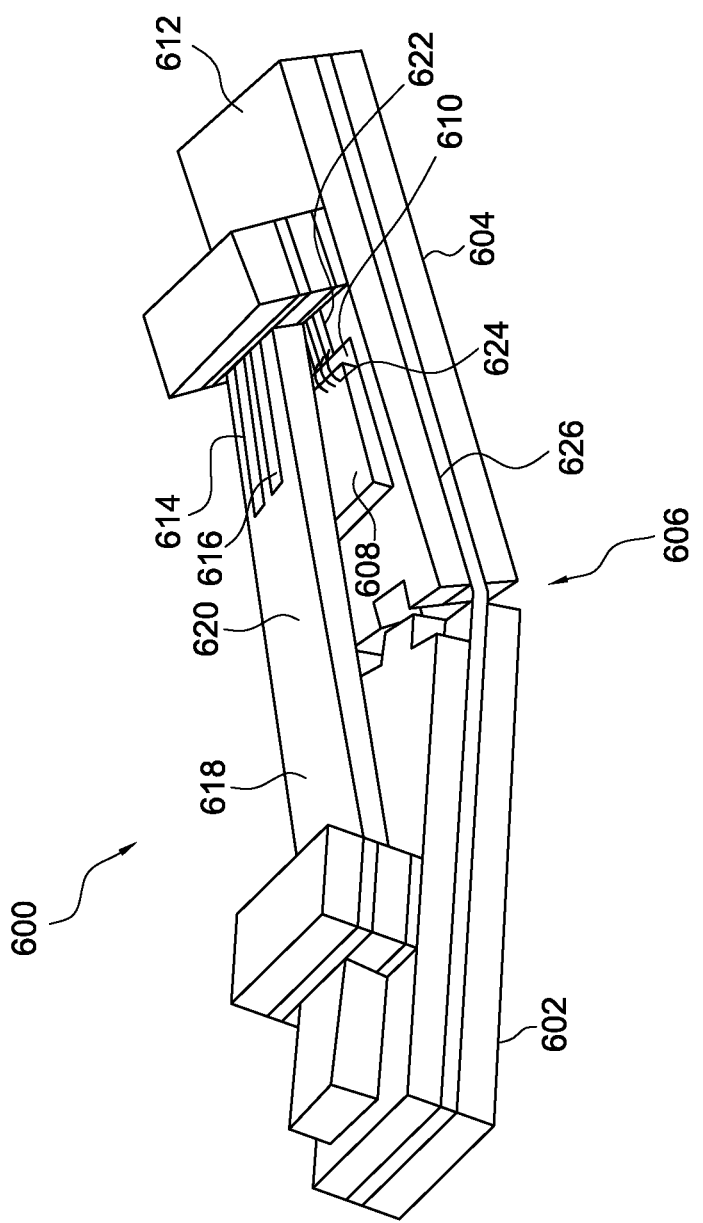
FIG. 6 shows, in schematic perspective view, still further aspects of a laminated assembly prepared according to principles of the invention.

FIG. 6 illustrates such an assembly 600 including a first substantially rigid portion 602 mutually coupled to a second substantially rigid portion 604 by a hinge feature 606. A device such as, for example, an electronic device 608 is disposed within a cavity 610 formed within an upper layer 612 of substantially rigid portion 604. First 614 and second 616 printed circuit style conductors are disposed on an upper surface 618 of a tendon member 620. Conductors exported at 616 are operatively signalingly coupled to further printed circuit style conductors e.g., 622 disposed on an upper surface of upper layer 612 by way of printed circuit vias, as are known in the printed circuit arts. In the illustrated embodiment, a wire bond, e.g. 624 couples conducted 622 to a corresponding contact on the electronic device 608.

It will be appreciated that, while the example discussed above refers to electrical conductors other communications means will be employed in alternative embodiments of the invention. Thus, for example, optical signal conductors, pneumatic signal conductors, hydraulic signal conductors, and any other appropriate means for conducting power and/or information within and across the inventive assembly is contemplated to be within the scope of the invention.

In various embodiments, the electronic device 608 will include, for example, one or more of a microprocessor, a microcontroller, a quantum computer, a dedicated logic device such as a programmable logic device (PLA), or a memory device any of which are of any configuration known, or that becomes known, in the art. Moreover, the electronic device 608 will also, in certain embodiments, include one or more of an accelerometer, a micro-electro-mechanical (MEMS) system a chemical or biological analysis device such as a microfluidic analysis device, or any other device, electronic or otherwise, advantageously employed according to a desirable embodiment of the invention. In still further embodiments, the device 608 will not be purel electronic, but photonic (such as, for example and without imitation a red laser gyroscope subsystem, a laser subsystem or the photochemical subsystem) or may be purely optical, such as a purely optical computer device.

It will also be appreciated that, in certain moments of the invention, the device 608 will be bound within cavity 610 by an adhesion between a lower surface thereof and a region of adhesive layer 626. In other embodiments, the device 608 will be held in place by other means such as, for example and without limitation, a spring clip or an overlying layer of rigid or flexible material.

Of course it will be appreciated that pre-formed or standard circuit board and flexible circuit assemblies will be embedded within certain embodiments of the invention. It will also be appreciated that existing printed circuit techniques and apparatus will be employed in the present new context with surprising and beneficial results.

FIGS. 7A 7B and 7C show, in schematic elevation, further aspects of an assembly and device 700 prepared according to principles of the invention. Assembly 700 includes a layer 702 having a three-dimensional or "3-D" aspect or feature 704. In the illustrated embodiment, the layer 702 is shown as a layer of spring steel and the 3-D feature 704 is a curved spring deformation of the layer that tends to flatten out when subjected to sufficient external pressure, but to resume a curved aspect when the external pressure is released. It will be appreciated by the reader, however, that a wide variety of devices and materials will be applicable to present a 3-D aspect according to principles of the invention.

Some of these, like the spring steel, will be elastic in nature. Others will have an active characteristic and still others will be substantially elastic but assume a 3-D aspect in response to an external stimulus as where, for example, a sheet metal alloy device resumes an earlier configuration when exposed to a temperature within a particular range of temperatures.

In light of the foregoing discussion, and with further reference to FIG. 7A it is readily apparent that the assembly 700 includes substantially rigid layers 706, 708 and 710. Substantially flexible layer 712 is disposed between layers 706 and 708 and between corresponding adhesive layers 714 and 716. Generally elastic (here's spring steel) layer 702 is disposed between substantially rigid layers 708 and 710 and between corresponding adhesive layers 718 and 720. It will be appreciated that all of the layers are viewed in side view and, in fact, would extend into the plane of the drawing.

Prior to assembly, the generally elastic layer 702 includes a deformation or curvature 704. It will be appreciated that, if upper surface 722 of generally elastic layer 702 extends in a first dimension 724 within the plane of the drawing and in a second dimension 726 into the plane of the drawing, the deformation or curvature 704 extends the layer 702 into a third dimension 728, also in the plane of the drawing; hence the designation of layer 702 as a "3-D" layer.

As shown in FIG. 7A prior to assembly curvature 704 is unencumbered and fully extended. Referring, for example, to process 300 (as discussed above), it will be appreciated that various layers of assembly 700 will be aligned (typically employing alignment/fixturing apparatus) and compressed during a bonding process. The compressor force is applied during bonding and as part of the curing conditions will tend to do form the material of layer 700 and flatten curvature 704 into a planar configuration.

Thus, as shown in FIG. 7B layer 702 and, indeed, all of the layers of the assembly 700 exhibit a substantially planar aspect with essentially no deviation in dimension 728. In particular, region 704 is substantially flattened and an exposed region 730 of substantially flexible layer 712 is also disposed in a substantially coplanar orientation with respect to the balance of layer 712.

Once during its complete, however, and the assembly 700 is released from any fixturing apparatus, and any necessary action is taken to release the assembly 700 from any surrounding scaffolding material, a different condition ensues. As shown in FIG. 7C because of its spring characteristic, region 704 tends to resume its pre-existing curvature urging a lower surface 732 of layer 708 away from an upper surface 734 of layer 710. However, because assembly portion 736 is typically coupled to the balance of the assembly 700 by exposed region 730 of substantially flexible layer 712 surface region 732 tends to pivot 738, as shown.

Thereafter, assembly portion 736 will respond generally elastic way to an applied force 740. One of skill in the art will appreciate the potential for applying such an assembly in the development of a wide variety of devices such as, for example and without limitation, a haptic keyboard, a limit switch, an audio transducer, accelerometer, a shock absorbers, and any of the wide variety of other devices and systems all of which are considered to be within the scope of the present invention.

Source layers with three-dimensional structures will include, insert embodiments, "formed layers" that can be created by a variety of means. In certain embodiments, one will start with a flat source sheet that can attain three-dimensional structure through a variety of processes including, but not limited to: selective depth etching, selective depth machining, 3-D printing, describing, die stamping, embossing and roll forming. Such 3-D layers really add to the capability of a laminated device. For example they allow the inclusion of springs, clips, electrical contacts, gripping surfaces, latches, tabs, corrugated elements, stiffened element, and much more. Of particular utility is an expanded ability to store elastic energy within a laminate. Elastic materials with three dimensional features can be fully or partially "flattened" during lamination, storing energy. After lamination, flattened features can be used to apply forces with force components perpendicular to the laminate.

Figure 8:
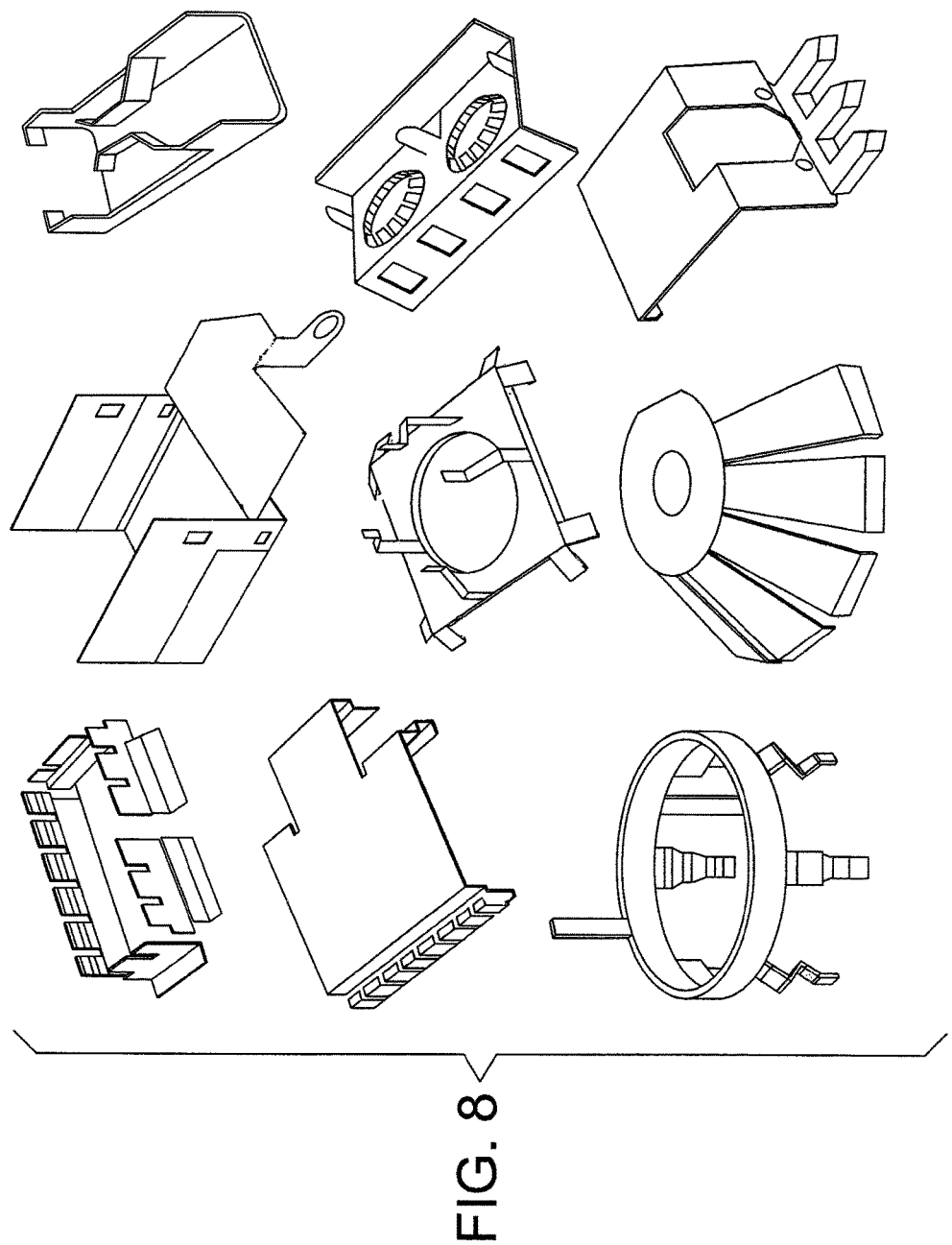
FIG. 8 shows, in photographic perspective view, various manufactured components exemplifying possible configuration features for application to an elastic portion for inclusion in an assembly prepared according to principles of the invention.

Without in any way intending to limit the scope of this disclosure, FIG. 8 illustrates a variety of exemplary configurations into which a material such as, for example, spring steel, can be formed to provide a three-dimensional configuration. It should also be noted that the placement of magnets within an assembly 700 can provide and affect corresponding to a "3-D" layer by supplying a localized magnetic fields to effect a desirable attraction or repulsion between portions of an assembly.

Other applications of magnets within an assembly prepared according to the invention include providing forces effective to activate the assembly into a folded 3-D state, and forces effective to lock the assembly in an assembled state or any other desirable state either fixedly and terminally, or temporarily and/or repeatably. One of skill in the art will appreciate that one or more pre-magnetite elements can be deposited within respective cavities provided in various layers of assembly (comparable to cavity 610 of FIG. 6). Alternately, particular regions of a magnetizable layer will, in some embodiments, be magnetized in situ before after bonding of the layers within the assembly. In still other embodiments, a layer of particulate material deposited between layers will include a magnetic characteristic, either in advance of assembly, or as a result of post-assembly magnetization.

Still other applications for magnets within such an assembly include sensing and signaling of a particular state or orientation of an element of an assembly prepared according to principles of the invention. Thus, a magnet disposed within a portion of assembly may be used to activate a sensor such as, for example, a magnetic reed switch or a Hall effect transducer.

Figure 9:
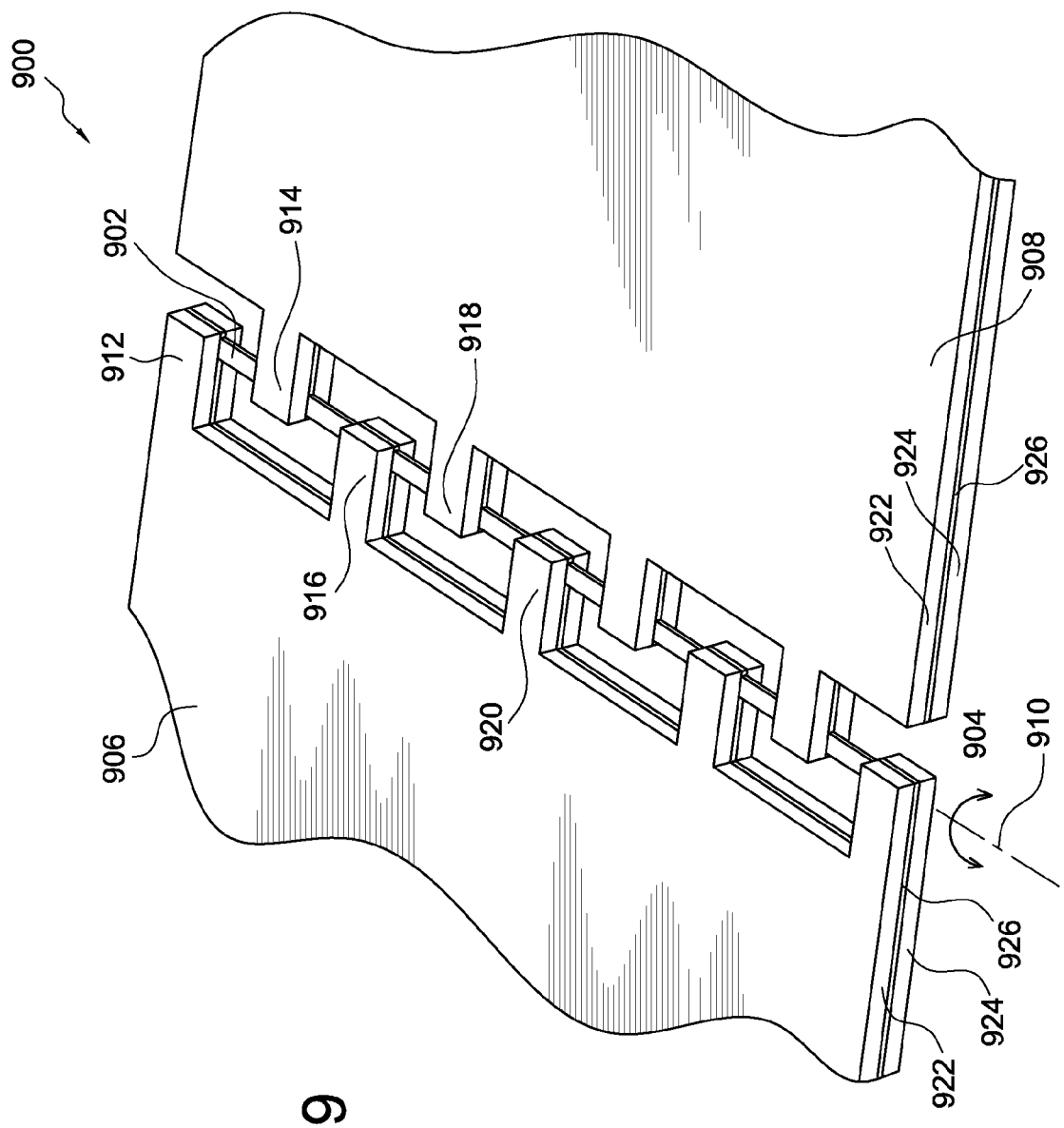
FIG. 9 shows, in schematic perspective view, a portion of an assembly including a torsion hinge prepared according to principles of the invention.

FIG. 9 illustrates a further aspect of an exemplary assembly prepared according to principles of the invention and shows part of a torsion joint 900. The torsion joint 900 includes a flexure beam portion 902 that is subject to a simple bending torque during operation of the joint. In various embodiments, the flexure beam 902 will include one or more of a generally planar flexure material, a fiber, a bundle of fibers, a ribbon, a woven textile strap, or any other appropriate configuration and material effective to produce the required rotation 904 of a first generally rigid member 906 with respect to a second generally rigid member 908 about a longitudinal axis 910.

In the illustrated embodiment, torsion joint 900 also includes a plurality of interleaved extensions, e.g., 912, 914, 916, 918, 920. The flexure beam 902 is typically disposed in respective distal ends of the extensions. The extensions, as well as the generally rigid members 906, 908 include first 922 and second 924 layers of substantially rigid material with a layer 926 of more or less elastic material, from which the flexure beam portion 902 is formed, disposed between the substantially rigid layers.

Although not expressly identified in FIG. 9, it is to be understood that, in at least some embodiments, additional layers of adhesive material are disposed between the layers 922, 924 and layer 926. These additional layers of adhesive material serve to bond the entire assembly together.

One of skill in the art will understand that the rotation 904 of member 906 with respect to member 908 can result in high stresses on the flexure beam portion 902. Under some circumstances, the stresses can result in your fracture and/or plastic deformation of the flexure beam material. Accordingly, in certain embodiments, it will be desirable to provide a mechanical stop to prevent over-rotation of the torsion joint and thus avoid premature failure of the assembly as a whole.

Figure 10A:
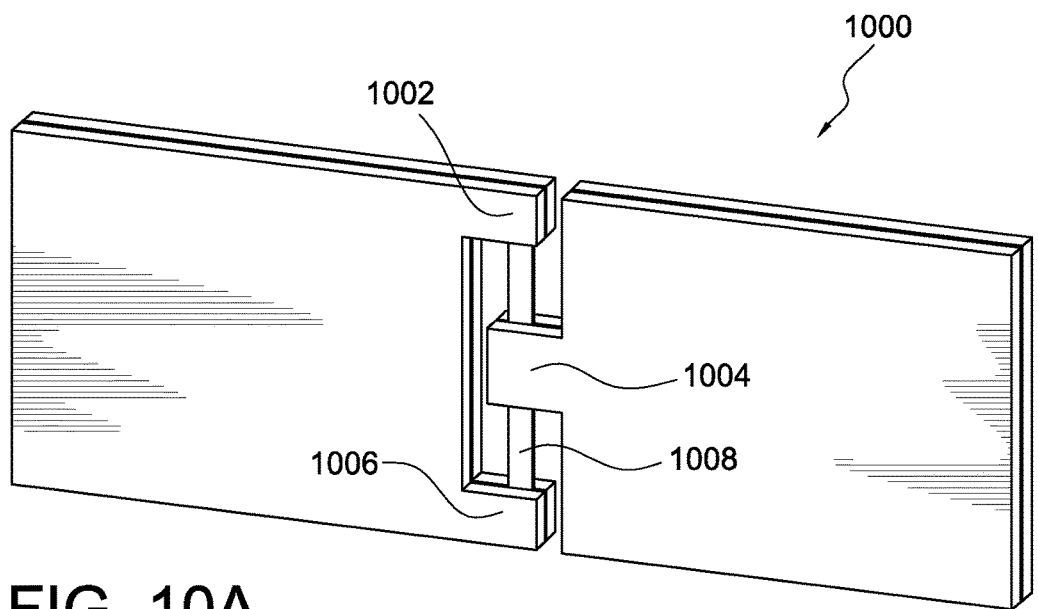
FIG. 10A shows, in schematic perspective view, a further portion of an assembly including a torsion hinge prepared according to principles of the invention.

FIG. 10A shows the basic unit of a torsion joint 1000 including interleaved extended support regions 1002, 1004, 1006 and a flexible flexure beam 1008.

Figure 10B:
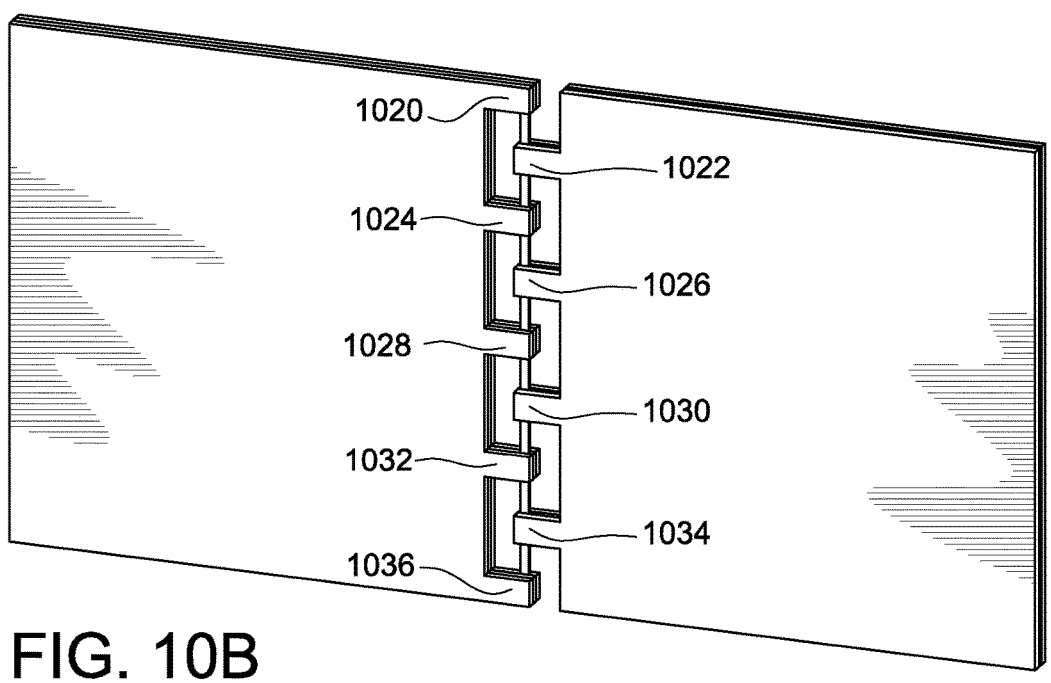
FIG. 10B shows, in schematic perspective view, a still further portion of an assembly including a torsion hinge prepared according to principles of the invention.

FIG. 10B Illustrates an advanced torsion joint using multiple attachment points 1020, 422, 1024, 1026, 1028, 1030, 1032, 1034, 1036 for greater off-axis stability.

It will also be noted that a torsion joint repaired according to principles of the invention will, in certain embodiments and depending on particular materials and dimensions employed, have a high spring constant and may not exhibit your rotation. Again, in certain applications these characteristics will be advantageously employed.

In the torsion topology, the joint rotates with the restoring force much lower than that resulting from a bending topology. This can enable low-torque operation for delicate mechanisms such as mechanical watch actions. Conversely, this apology enables use of stiffer and more robust joint materials, such as spring steel and other metals, while limiting the torque needed to actuate the device.

Symmetry about the axis leads to a joint trajectory closer to your rotation than other designs. Lower stresses in the joint material also increased mechanical efficiency by reducing loss to degeneration.

Figure 11:
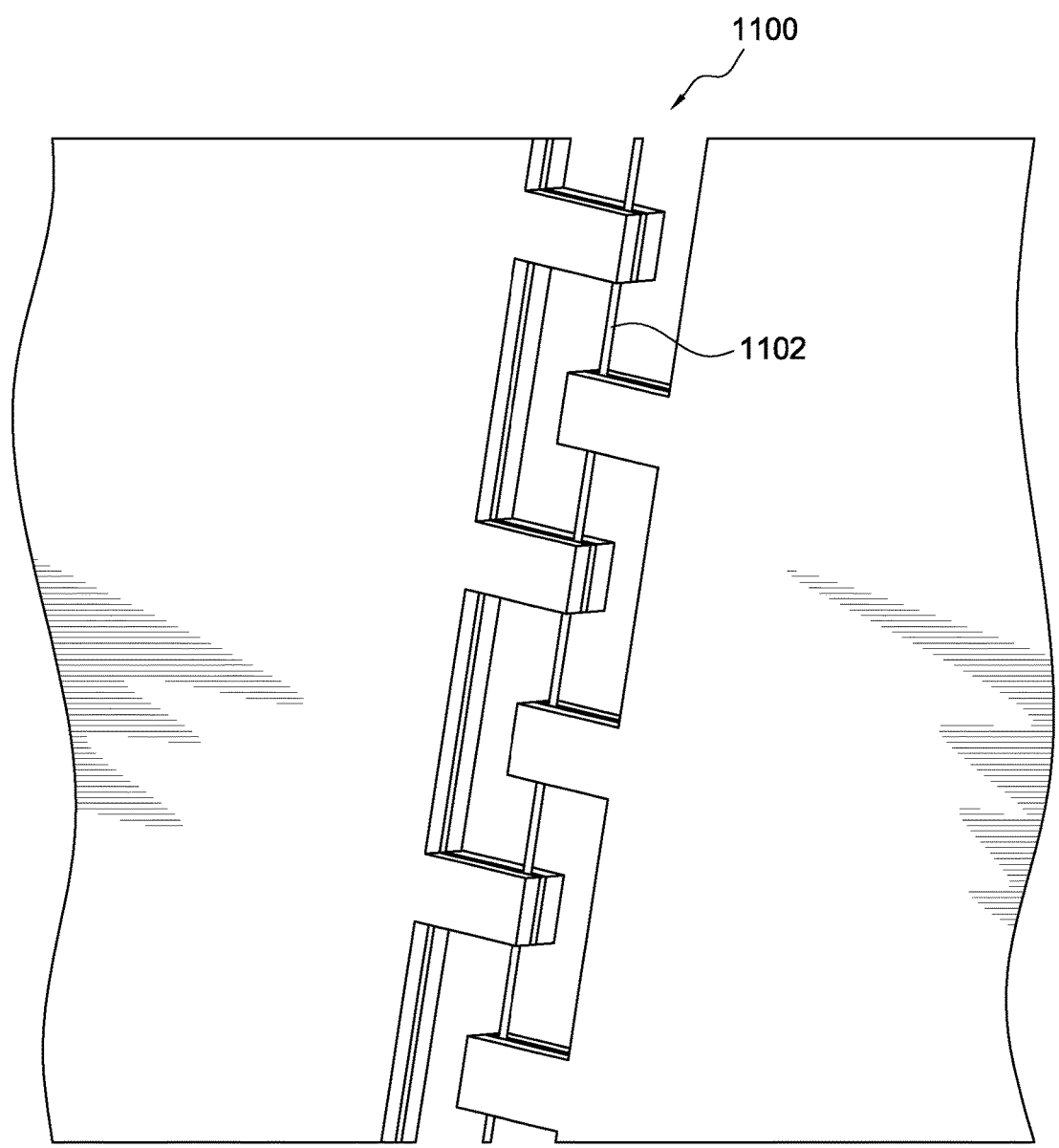
FIG. 11 shows, in schematic perspective view, a portion of an assembly including a torsion hinge having a fiber prepared according to principles of the invention.

Torsional joints can be created by including fibers or fiber bundles into the layout. Alternately, a fiber reinforced polymer can be used as a flexible layer. Optionally, the polymer can be dissolved in a subsequent process to leave the fiber or fiber bundle behind. FIG. 11 shows a torsion joint 1100 including a fiber 1102 as a flexure beam.

In the illustrated embodiment, the flexure beam fiber 1102 has a substantially circular cross-section. In other embodiments of the invention, however, the flexure beam fiber will have any of a wide variety of cross-sectional configurations including, for example and without limitation, a triangular cross-section, square cross-section, a pentagonal cross-section, a hexagonal cross-section, a heptagonal cross-section, or any other political cross-section appropriate to a particular application. In addition, in certain embodiments, the flexure beam fiber will have an elliptical cross-section, a stellate cross-section, or any other cross-section that is desirable in light of the application.

According to certain embodiments of the invention, a technique is provided whereby one or more elements of a laminated structure are secured within the assembly without relying on an adhesive. One of skill in the art will appreciate certain materials that might otherwise be desirable for use within an assembly, prepared according to the invention, will be problematic because of bond issues. That is, some materials are difficult to pair with an effective adhesive. This is especially the case with some elastomeric materials, where poor bonding will impair or prevent these materials from being integrated into a laminate assembly.

Consequently, in certain embodiments of the invention, it will be advantageous to employ a mechanical fastener of one form or another to couple one or more elements of the assembly together. Such a mechanical fastener will, in particular embodiments, include a rivet, a screw, a nut and bolt combination, a pin and cotter pin device, a spring dip device, a bolt and toggle arrangement, a screw and molly bolt device, or any other mechanical fastener or mechanical fastening system such as is known or becomes known in the art.

One of skill in the art will appreciate that such a mechanical fastener will, in certain embodiments, be used in combination with an adhesive material, and that a variety of mechanical fasteners may be used in combination with one another, each combination corresponding to the requirements of a particular application.

In certain methods and embodiments, a mechanical fastener will be employed to couple the elements of one portion of an overall assembly to one another while a subsequent process coupled further elements to the assembly. The subsequent process may include additional mechanical fasteners, adhesive materials, and/or any other appropriate coupling mechanism (e.g., electric spot welding, ultrasonic welding, laser welding, etc.). In certain moments, the one portion of the overall assembly will constitute a subassembly.

In still further embodiments of the invention, a portion of one or more mechanical fasteners will beyond an outer surface of a subassembly and be effective as a fixturing pin or dowel to assist in or effect the alignment of further assembly elements during assembly. Again, the further assembly elements may be coupled to the balance of the assembly by use of the same fixturing pin as a mechanical fastener, and/or by the addition of an adhesive or any other bonding means such as described above and/or is known in the art.

In still further embodiment of the invention, one or more mechanical fasteners are employed in the process of preparing a subassembly and/or an assembly. Thereafter, at some point in the course of assembly and/or using the resulting device, that mechanical fastener is removed, or otherwise displaced from the assembly. Thereafter, the integrity of the assembly will, in certain embodiments, be maintained by another teacher, such as a further mechanical fastener, adhesive, or any other bonding as described.

Mechanical fasteners will, in appropriate embodiments, have a variety of characteristics appropriate to the particular application. Thus, in certain applications, the mechanical fastener will be include electrically conductive conducted material, an optically conductive material, an insulating material and/or an opaque material, a thermally conductive material and/or a thermally insulating material. In certain embodiments, a mechanical employed in a device according to principles of the invention will include any appropriate material including, for example and without limitation, a metallic material (e.g., stainless steel, mild steel, high-speed steel; alloys of nickel, titanium, aluminum, and rare earth metals, taken alone or in combination), polymeric material including natural and synthetic polymers; and inorganic material, or any other beneficial material or combination of materials.

Mechanical fasteners will also, in appropriate circumstances, have a variety of geometric characteristics including, for example, a circular cross-section, a triangular cross-section, a square cross-section, rectangular cross-section, any other polygonal cross-section, ellipsoid cross-section, a stellate cross-section, or any other cross-section or combination of cross-section. Likewise, mechanical fasteners will be tapered or otherwise configured to match the needs of a particular application.

Figure 12B:
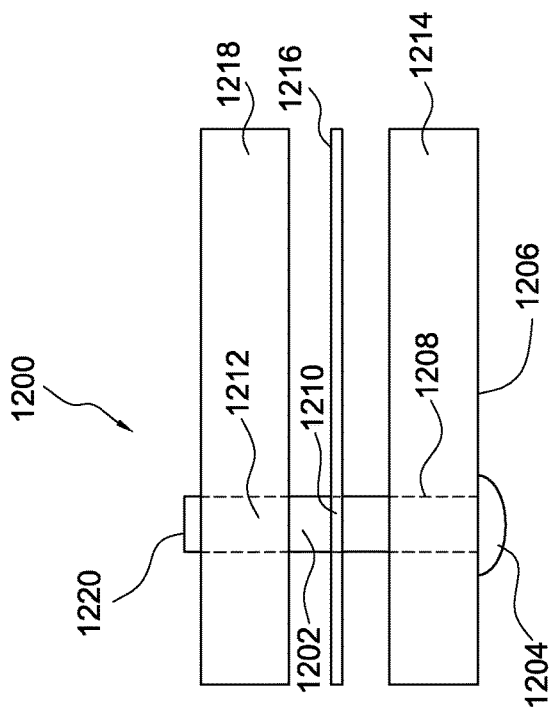
FIG. 12B shows, in schematic exploded side view, a portion of an assembly including a fastening device prepared according to principles of the invention.
Figure 12C:
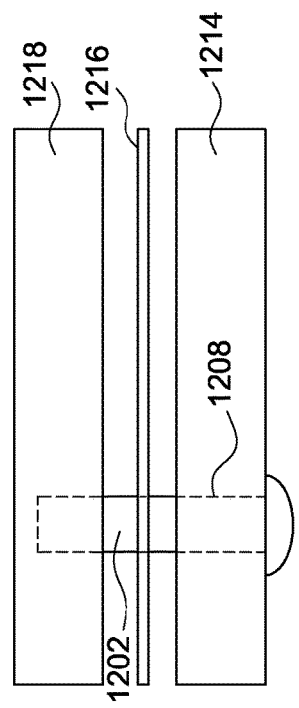
FIG. 12C shows, in schematic exploded side view, further aspects of an assembly including a fastening device prepared according to principles of the invention.
Figure 12A:
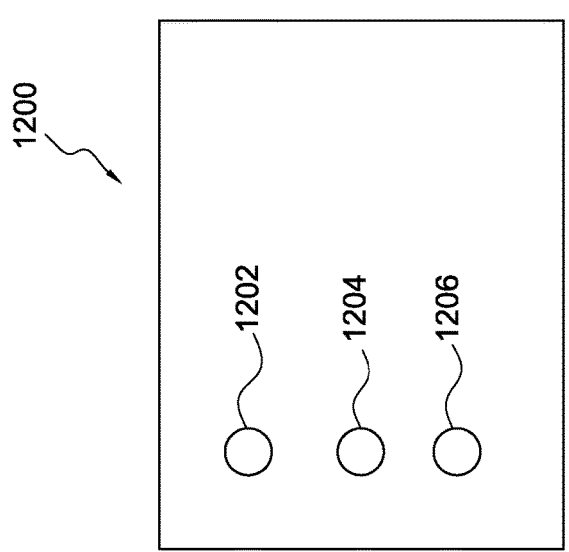
FIG. 12A shows, in schematic top view, a portion of an assembly including a fastening device prepared according to principles of the invention.

FIG. 12A shows, in schematic side view, further features of an assembly 1200 produced according to principles of the invention. In particular, assembly 1200 includes a plurality of mechanical bonding elements 1202, 1204, 1206. In the illustrated embodiment, these bonding elements are shown as rivets but, in view of the foregoing, one of skill in the art will appreciate that one or more of the same may be a different mechanical fastener.

FIG. 12B shows, in schematic side view, the assembly 1200 according to a first embodiment and including a rivet 1202. The rivet 1202 includes, in the illustrated embodiment, a head portion 1204 extending below a lower surface 1206 of the laminate assembly. The rivet 1202 is disposed within respective bores 1208, 1210 and 1212 of corresponding layers 1214, 1216 and 1218 of the laminate assembly. One of skill in the art will appreciate that, after assembly, and in certain moments with the layers under external pressure, an upper end 1220 of the rivet 1202 will be deformed by the application of, for example, mechanical force to secure the rivet in place and maintain the layers in intimate contact with those adjacent.

FIG. 12C shows a further embodiment of the invention in which a rivet 1202 is disposed within respective bores 1208, 1210. Layer 1218, however, has a configuration such that the rivet 1202 is disposed outwardly of an external edge, or within a larger aperture, of that layer and not within a constricted bore of the same. In such an embodiment, layer 1218 may, for example, be bonded adhesively to layer 1216, maybe held in place by the mechanical fasteners, or may have some ability to move with respect to layer 1216, e.g. by translation into the surface of the drawing.

It will be appreciated that, although the rivets just illustrated are shown to be disposed completely through the assembly, in other embodiments, a mechanical fastener may be arranged to be disposed through only a portion of an assembly. For example, it may have a length that is shorter than a height of the assembly.

In a further aspect of the invention, the riveting technique may be used to store energy within laminate. Holes or bores in riveted material can be located such that one or more material must be inelastically or elastically deformed before engaging with posts or pins. Such deformation may be tensile, compressive, torsional, or any combination of the same. By such a technique, elastic energy can be stored in riveted material. This stored energy may serve, among other purposes, to activate a folding process or provide a restoring force for a displaceable subassembly.

In certain instances it will be beneficial to employ a bearing device that allows a more complete rotation than, for example, the torsion hinge described above in relation to FIG. 9. In such an embodiment, the application of a bearing, such as a rotary bearing, in combination with other features of the invention will have surprising benefits.

Figure 13:
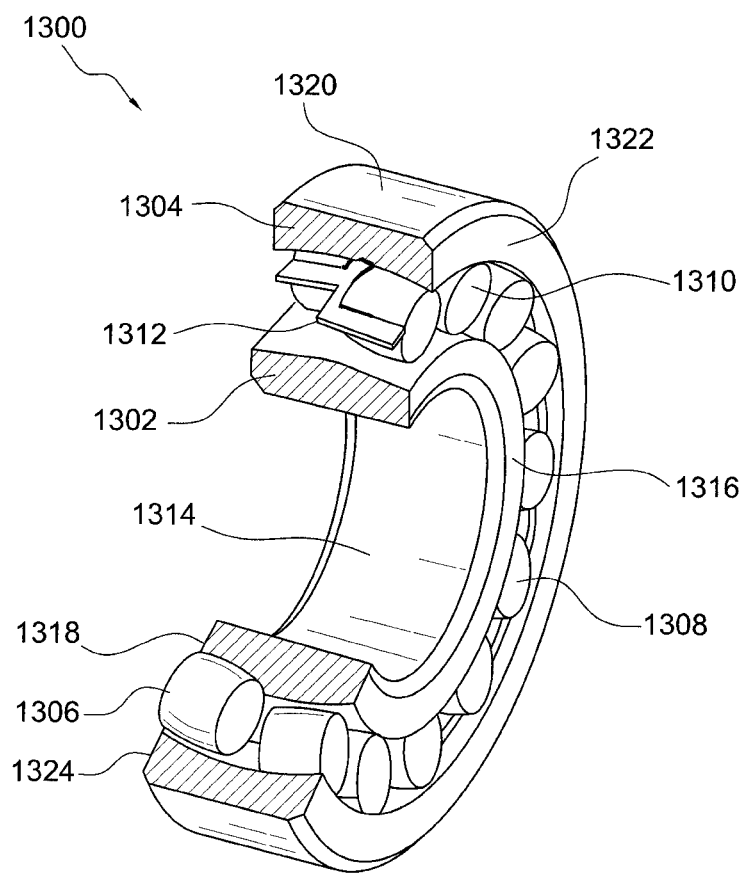
FIG. 13 shows, in cutaway perspective view, a portion of a bearing device for use in an assembly prepared according to principles of the invention.

FIG. 13 shows, in cutaway perspective view, a mechanical bearing assembly 1300, exemplary of many possible bearing configurations that will be employed in various corresponding configurations and embodiments prepared according to principles of the invention. The illustrated bearing includes an inner race 1302, and outer race 1304, and a plurality of individual bearings, e.g., 1306, 1308, 1310. The illustrated individual bearings are shown as spherical roller bearings, but one of skill in the art will appreciate that any of the wide variety of other bearing configurations will be readily beneficially employed in corresponding embodiments of the invention. Thus, for example, in certain embodiments, one or more of a ball bearing, a roller bearing, a needle bearing, a pushing, a magnetic bearing, an electrostatic bearing, a ferrofluidic bearing, an air bearing or other hydrodynamic bearing, or any other bearing arrangement that is known, or that becomes known in the art will be advantageously employed.

The illustrated bearing assembly also includes a bearing holder 1312 that maintains a desirable spacing of the individual bearings in a manner well known in the art. The inner race 1302 has an inner circumferential surface region 1314 and, for example, first 1316 and second 1318 radial surface regions. In like fashion, the outer race 1304 has an external circumferential surface region 1320 and first 1322 and second 1324 radial surface regions.

Figure 14:
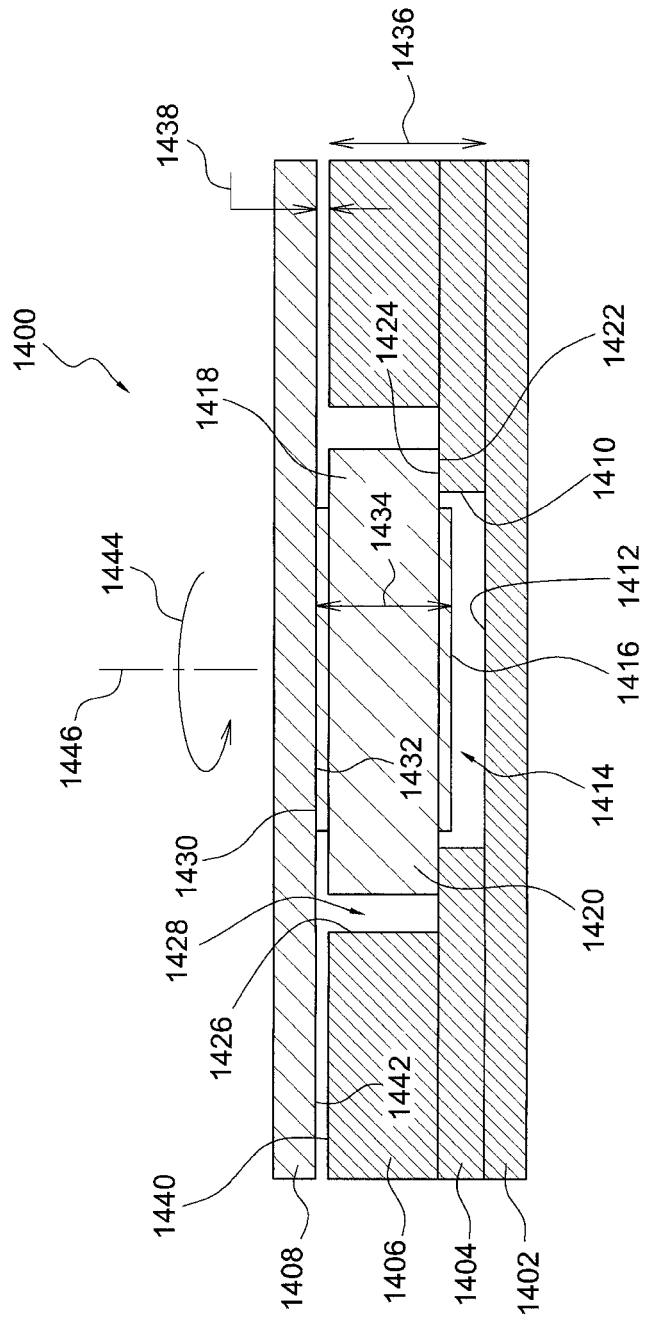
FIG. 14 shows, in schematic side view, an assembly including a bearing device prepared according to principles of the invention

FIG. 14 shows, in schematic side view, a portion of apparatus 1400 prepared according to principles of the invention. The illustrated apparatus includes first 1402, second 1404, third 1406 and forth 1408 generally planar and substantially rigid members or layers of material.

Layer 1404 includes an inner circumferential surface region 1410 that defines an aperture in that layer. Circumferential surface region 1410, in conjunction with a corresponding upper surface region 1412 of layer 1402, defines an aperture 1414 within which a portion of an inner race 1416 of a bearing device 1418 is disposed and within which the inner race can turn freely. An outer race 1420 of bearing device 1418 includes a radial surface region 1422 that is disposed adjacent to and supported by a corresponding upper surface region 1424 of layer 1404.

Layer 1406 includes an internal circumferential surface region 1426 defining a further aperture or cavity 1428 that accommodates bearing device 1418. A further radial surface region 1430 of inner race 1416 is disposed adjacent to and arranged to support a corresponding lower surface region 1432 of layer 1408. In certain embodiments, an axial dimension 1434 of the bearing device is arranged in conjunction with a cumulative thickness 1436 of layers 1404 and 1406 so as to maintain a desirable spacing 1438 between an upper surface region 1440 of layer 1406 and an adjacent lower surface region 1442 of layer 1408. In other embodiments, the surface region will be in contact, but will have material characteristics that result in desirable levels the friction between the two layers.

It will be noted that adhesive layers are omitted from the foregoing discussion of FIG. 14 so as to reduce the complexity of that presentation and improve clarity. One of skill in the art will appreciate that any desirable adhesive or fixturing mechanism will be employed vis-à-vis the various layers and/or the bearing device. It will also be understood that, in certain embodiments, characteristics of the raise layers will be selected for particular desirable properties. Thus, for example, in a certain embodiment, layer 1404 may be less rigid than, e.g., adjacent layers 1402 and 4006. Consequently, layer 1404 will provide a shock absorbing characteristic to the illustrated mounting of the bearing device 1418.

Of course it will be appreciated that illustrated arrangement will, in certain embodiments, allow a substantially unrestricted rotary motion 1444 of layer 1408, with respect to the balance of the illustrated layers, around a longitudinal axis 1446 of the bearing device 1418. A practitioner of ordinary skill in the art will appreciate that a bearing device 1418 will, according to certain aspects of the invention, be deposited in an aperture 1414, 1418 using well known pick-and-place manufacturing techniques.

FIGS. 15A, 15B and 15C show various miniature bearing devices and arrangements that will form novel and beneficial combinations with corresponding embodiments of the present invention. For example, FIG. 15A shows a "jewel bearing" device 1500 that will be employed in certain embodiments prepared according to principles of the invention. The jewel bearing device includes a jewel portion 1502 formed of a hard and robust material such as, for example, diamond, ruby, emerald quartz, etc. The jewel portion 1502 is disposed smugly within an aperture formed by an inner circumferential surface region 1504 of a layer 1506 of, e.g., substantially rigid material. In certain embodiments, and adhesive will be provided between the jewel portion 1502 and surface region 1504 to ensure a substantially permanent fixation of the spatial relationship between the two.

In the illustrated embodiment, the jewel portion 1502 includes a further internal circumferential surface region 1508 which defines an aperture. Disposed within this aperture is a shaft 1510 with an external circumferential surface region disposed adjacent to and supported by surface region 1508. In certain embodiments, a lubricant material 1512 is disposed adjacent to shaft 1510 and surface region 1508. The lubricant will be, in various embodiments, a dry lubricant material, a liquid lubricant material, gaseous lubricant material, or any other available material appropriate for particular circumstances. The lubricant well, in corresponding embodiments, be held in place by surface tension/capillary action, gravity, where orientation of the assembly is appropriate, magnetic force, etc.

FIG. 15B shows a more complex bearing device 1540. Bearing device 1540 includes a first jewel portion 1542 and a second jewel portion 1544. Second jewel portion 1544 includes a surface region 1546 range to interface with a corresponding radial surface region at an end of a shaft 1550. Consequently, this arrangement provides a superior provision of alignment of the shaft when used for its thrust bearing capability, as compared with device 1500. Again, an optional lubricant material 1552 is shown disposed within a cavity 1554.

FIG. 15C shows, with a plurality of arrows, locations in which jewel bearings are used in a conventional mechanical watch assembly.

Figure 16B:
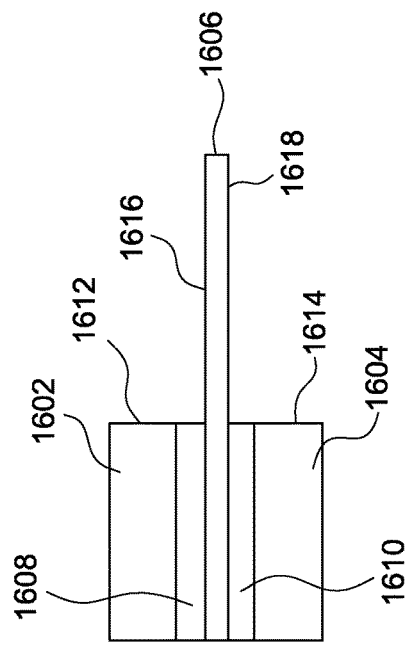
FIG. 16B shows, in schematic side view, a portion of a laminated assembly including an un-clamped hinge feature prepared according to principles of the invention.
Figure 16C:
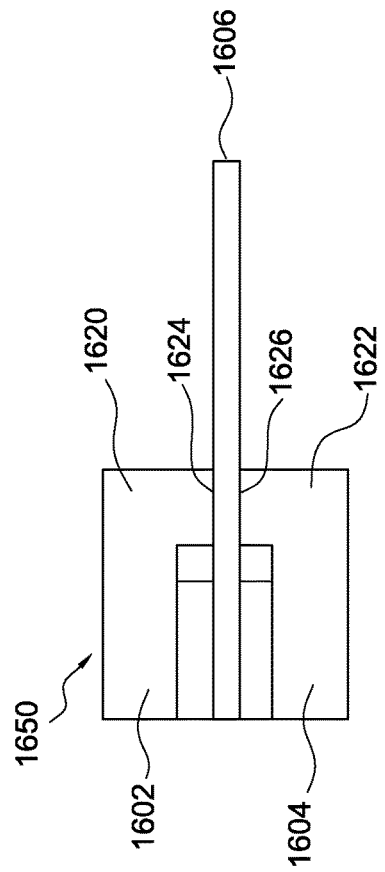
FIG. 16C shows, in schematic side view, a portion of a laminated assembly including a clamped hinge feature prepared according to principles of the invention.
Figure 16A:
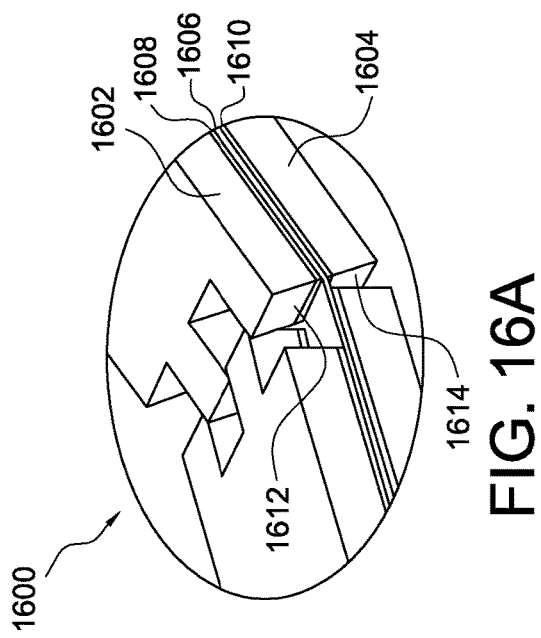
FIG. 16A shows, in schematic perspective view, a portion of a laminated assembly including a hinge feature prepared according to principles of the invention.

FIGS. 16A, 16B and 16C illustrate certain characteristics of an assembly including a clamped joint prepared according to principles of the invention. FIG. 16A shows a hinge device 1600 prepared according to principles of the invention like that illustrated in FIG. 4B above. The hinge device includes first 1602 and second 1604 substantially rigid layers, a substantially flexible layer 1606 and first 1608 and second 1610 adhesive layers. Respective terminal end surface regions 1612, 1614 of layers 1602 and 1604 are visible.

FIG. 16B shows, in additional detail, hinge device 1600 including substantially rigid layers 1602 and 1604 adjacent terminal end surface regions 1612 and 1614. It will be apparent on inspection that layers 1602 and 1604 are not in intimate contact with corresponding surface regions 1616, 1618 of flexible layer 1606, but are separated from it by the intervening adhesive layers 1608 and 1610.

FIG. 16C shows an alternative embodiment 1650 of the invention in which terminal end portions 1620, 1622 of layers 1602 and 1604 are disposed in intimate contact with flexible layer 1606 at respective surface regions 1624 and 1626. This arrangement provides additional support for the flexible layer 1606, vis-à-vis the rigid layer 1602 and 1604. Consequently, strength, endurance, repeatability and precision of the resulting hinge will, in certain embodiments, be improved.

FIGS. 17A, 17B and 17C show alternative clamped joint arrangements prepared according to principles of the invention. In FIG. 17A thin layers of substantially rigid material 1702, 1704 and respective thin adhesive layers 1706, 1708 cooperate to form a clamped region of flexible member 1710 between outer rigid layers 1712 and 1714. FIG. 17B illustrates an arrangement 1720 in which flexible layer 1722 includes an aperture or hole 1724. An adhesive material 1726 is disposed within the hole and in contact with internal surface region 1726, 1728 of respective substantially rigid layers 1730, 1732. As is evident on inspection, rigid layer 1730 and 1732 are deformed at respective regions 1734, 1736 so as to bring further surface regions 1738 and 1740 into supporting contact with flexible layer 1722. One of skill in the art will appreciate that adhesive material 1726 will serve to further locate and stabilize flexible layer 1722 with respect to substantially rigid layers 1730 and 1732, and thus tend to improve the overall precision and stability of the resulting joint.

FIG. 17C shows a further configuration 1750 that is generally similar to 1720. In configuration 1750, however, flexible layer 1722 includes an aperture 7052 in proximity to surface regions 1738 and 1740. An adhesive material 1754 is disposed within aperture 1752 to further stabilize the interface between the flexible layer 1722 and substantially rigid layers 1730 and 1732.

Figure 18B:
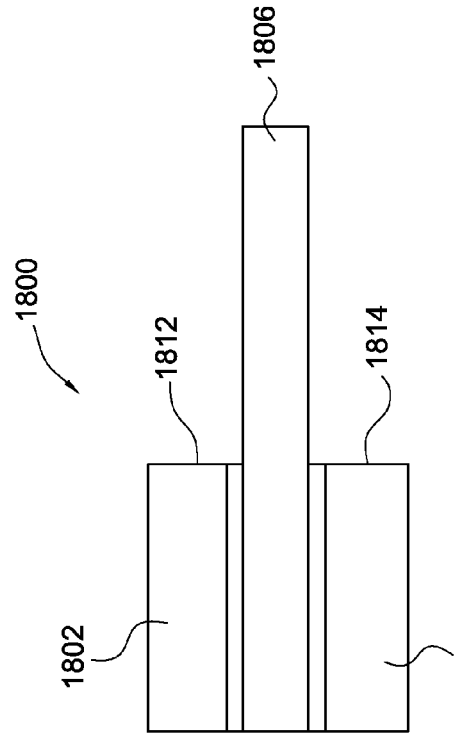
FIG. 18B shows, in schematic side view, a portion of a laminated assembly including an un-clamped hinge feature prepared according to principles of the invention.
Figure 18D:
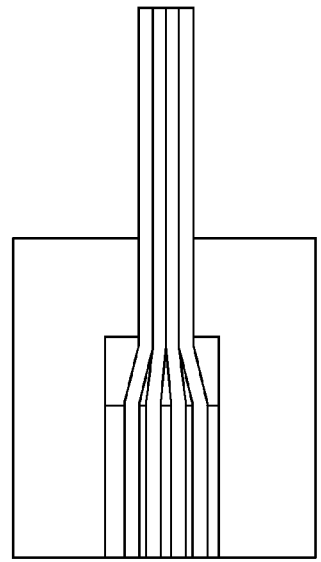
FIG. 18D shows, in schematic side view, a portion of a laminated assembly including a further clamped hinge feature prepared according to principles of the invention.
Figure 18A:
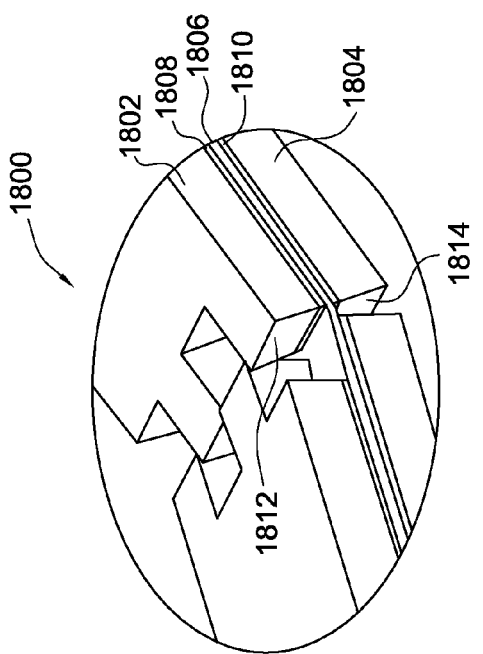
FIG. 18A shows, in schematic perspective view, a portion of a laminated assembly including a hinge feature prepared according to principles of the invention.

FIGS. 18A, 18B, 18C and 18D illustrate certain characteristics of an assembly including a multi-leaf joint prepared according to principles of the invention. FIG. 18A shows a hinge device 1800 prepared according to principles of the invention like that illustrated in FIG. 4B above. The hinge device includes first 1802 and second 1804 substantially rigid layers, a substantially flexible layer 1806 and first 1808 and second 1810 adhesive layers. Respective terminal end surface regions 1812, 1814 of layers 1802 and 1804 are visible.

FIG. 18B shows, in additional detail, hinge device 1800 including substantially rigid layers 1802 and 1804 adjacent terminal end surface regions 1812 and 1814. It will be apparent on inspection that flexible layer 1806 is a single monolithic layer.

Figure 18C:
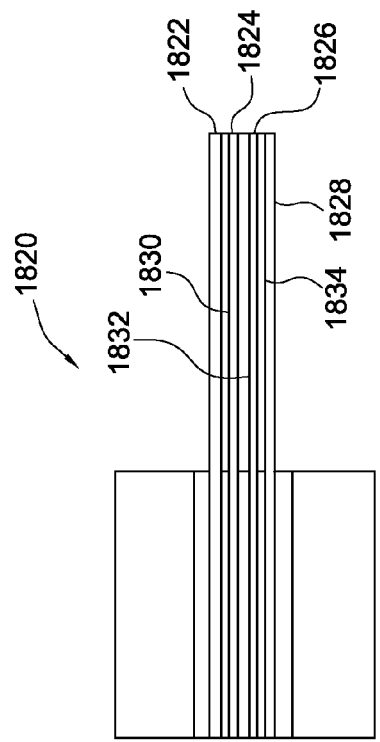
FIG. 18C shows, in schematic side view, a portion of a laminated assembly including a clamped hinge feature prepared according to principles of the invention.
Figure 19:
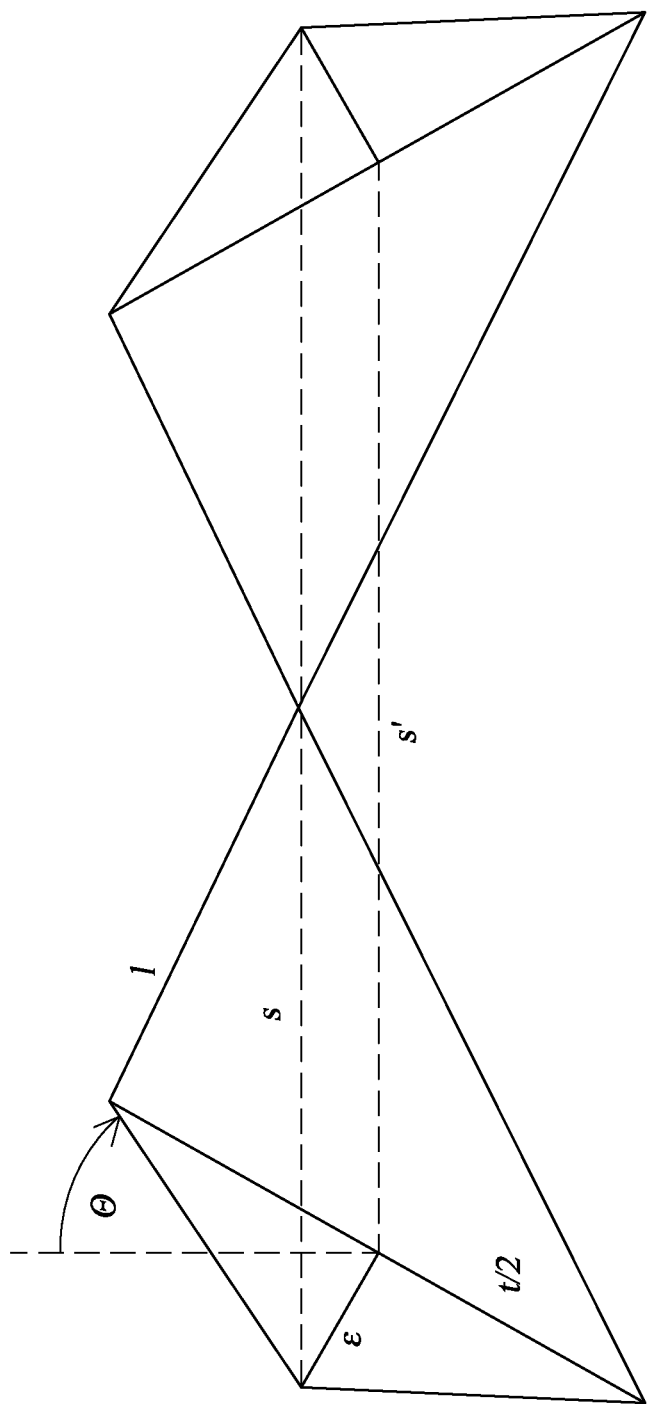
FIG. 19 shows, in kinematic diagram form, certain features of a laminated assembly including a hinge feature prepared according to principles of the invention.

FIG. 18C shows an alternative arrangement 1820 in which the flexible layer includes a laminated assembly with a plurality of thin flexible layers 1822, 1824, 1826 and 1828, 1830, 1832 and 1834. This multi-leaf flexure joint is accordingly created from two or more layers of material. A single flexure material can be used or different materials can be used to create a heterogenous flexure. Multi-leaf flexures can be combined with other enhancements such as the clamped joint as shown in FIG. 18D.

Without intending to be bound to a particular theory of operation, the multi-leaf flexure joint is believed to be characterized by lower peak bending stress as compared to a standard flexure joint. The bending element is divided into multiple layers able to slide against one another in shear. A similar methodology is used in leaf springs, a mainstay of automobile and truck suspensions. Multi-leaf joints will, in certain embodiments, have much longer lifetimes as compared to single leaf joints with the same net thickness of flexure material.

FIGS. 19, 20A, 20B, 21 and 22 illustrate certain characteristics of a multilayer joint prepared according to principles of the invention. A multilayer joint is distinguished from a multi-leaf joint inasmuch as the layers of a multilayer joint are disposed in parallel to one another and in orientation generally perpendicular to the respective planes of the members being rotationally coupled. The layers of a multi-leaf joint, on the other hand, are generally parallel with the planes of the members being rotationally coupled.

In brief, the multilayer joint is a novel arrangement of an arbitrary number of bending elements, or joints, interconnected in a manner such that the complete arrangement functions as a single effective joint with one degree of freedom. The motion of this combined joint is not a pure rotation: instead motion approximates the output of a serial chain of two links with both joint angles constrained to be equal in magnitude and sign.

This design increases robustness by lowering the bend angle of each individual joint while greatly reducing off-axis stresses on each. This design can easily produce a joint that withstands $8x$ the off-axis torque before failure while halving peak joint bending angle, all within the same footprint.

$$s'(\theta) = \sqrt{l^2 - \cos^2\theta\, t^2}$$

$$s(\theta) = \sqrt{l^2 - \cos^2\theta\, t^2} + 2\in \cos\theta$$

$$s_0 = s(\theta=0) = \sqrt{l^2 - t^2} + 2\in$$

Start with a base $s_0$, $t_0$, $\in_0$. A starting point is $s_0 = 2$ mm, $t_0 = 200$ μm, and $\in_0 = 0$. A simple linkage constructed according to FIG. 19 will exhibit perfect motion. However, multiple such linkages using different laminate layers (t is allowed to vary in discrete steps) can be combined with the same input and output beams with minimal deviation from the ideal case. There are many ways to minimize this deviation.

A first test case, we can set that the combined linkage is perfect at two points, start $\theta = 0$ and finish $\theta = \theta_f = 90°$, which defines $s_f = (\theta_f)$ for the base joint. We pick different laminate layers for the joints, defined by a new thickness $t_1$. We maintain the original $s_0$ to fix the same rotation point: this in essence binds the input and output beams of the combined linkage. We then solve for $\in$ by taking the lesser of two solutions to the quadratic equation:

$$0 = (s_0^2 - s_f^2 + \sin^2\theta_f t_1^2) + 4(s_f \cos\theta - s_0)\in + (4\sin^2\theta)\in^2$$

Figure 20B:
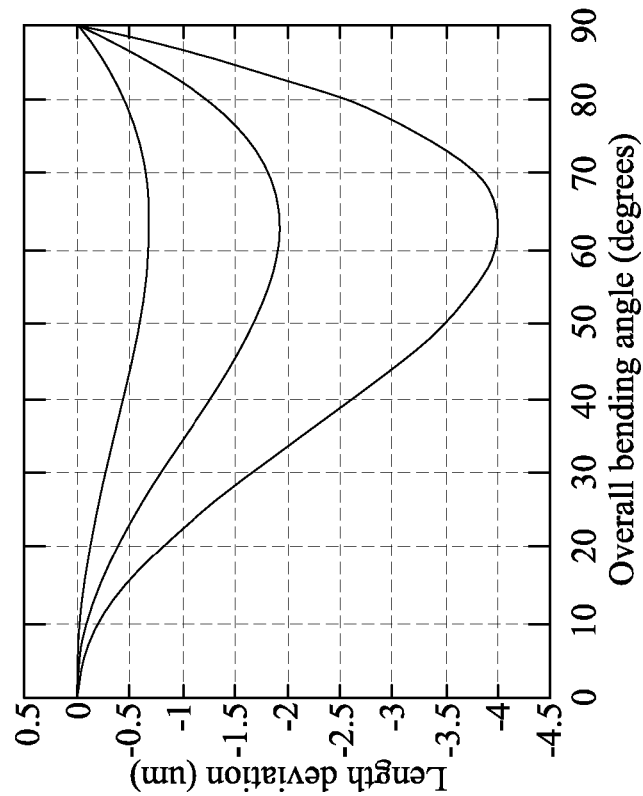
FIGS. 20A and 20B show in graphical form, information related to the operation of a laminated assembly including a hinge feature prepared according to principles of the invention.
Figure 20A:
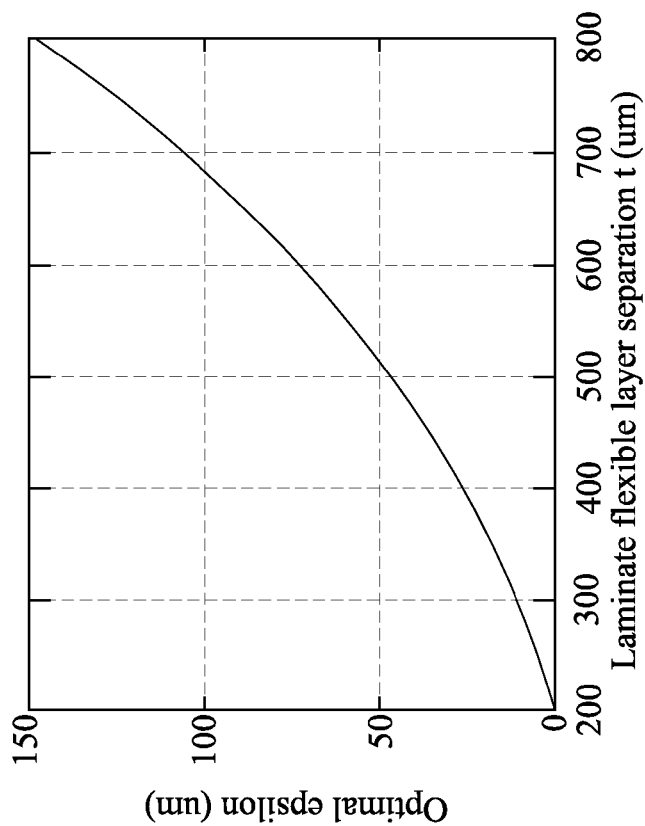

Looking at FIGS. 20A and 20B gives some insight. On the right, we see deviation from ideal for designs with t increasing in increments of 200 μm. With a 400 μm increase in t, there is a peak deviation of less than 2 μm occurring around 62°.

There are many other ways to alter $\in$ for each linkage to obtain desirable properties. One can optimize to minimize axis drift in some fashion across the whole motion, not just the endpoints. One can also manipulate $\in$ values to reduce mechanical interference of the combined linkage, with $\in = 0$ across all linkages a notable design point.

Figure 21:
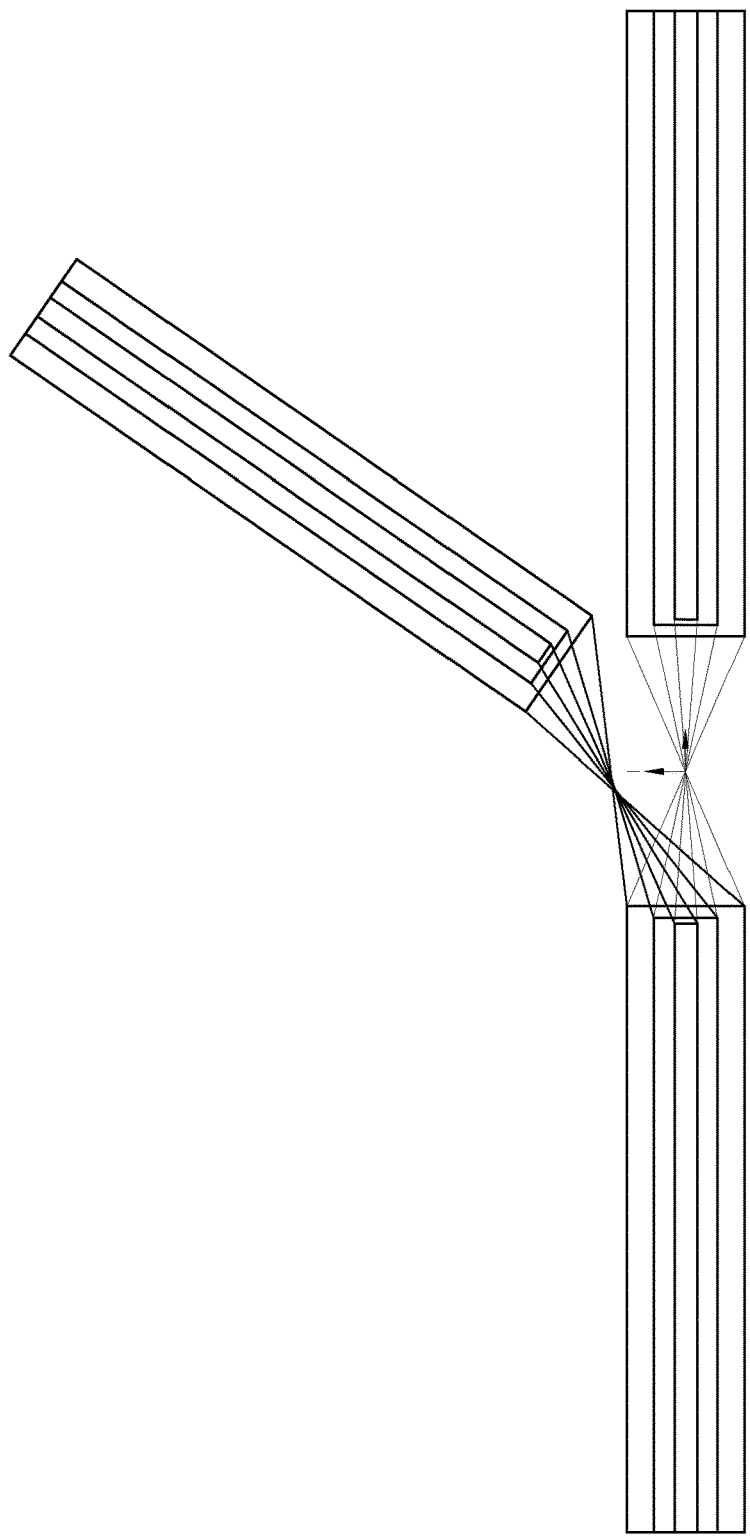
FIG. 21 shows, in schematic diagram form, certain features of a laminated assembly including a further hinge feature prepared according to principles of the invention.
Figure 22:
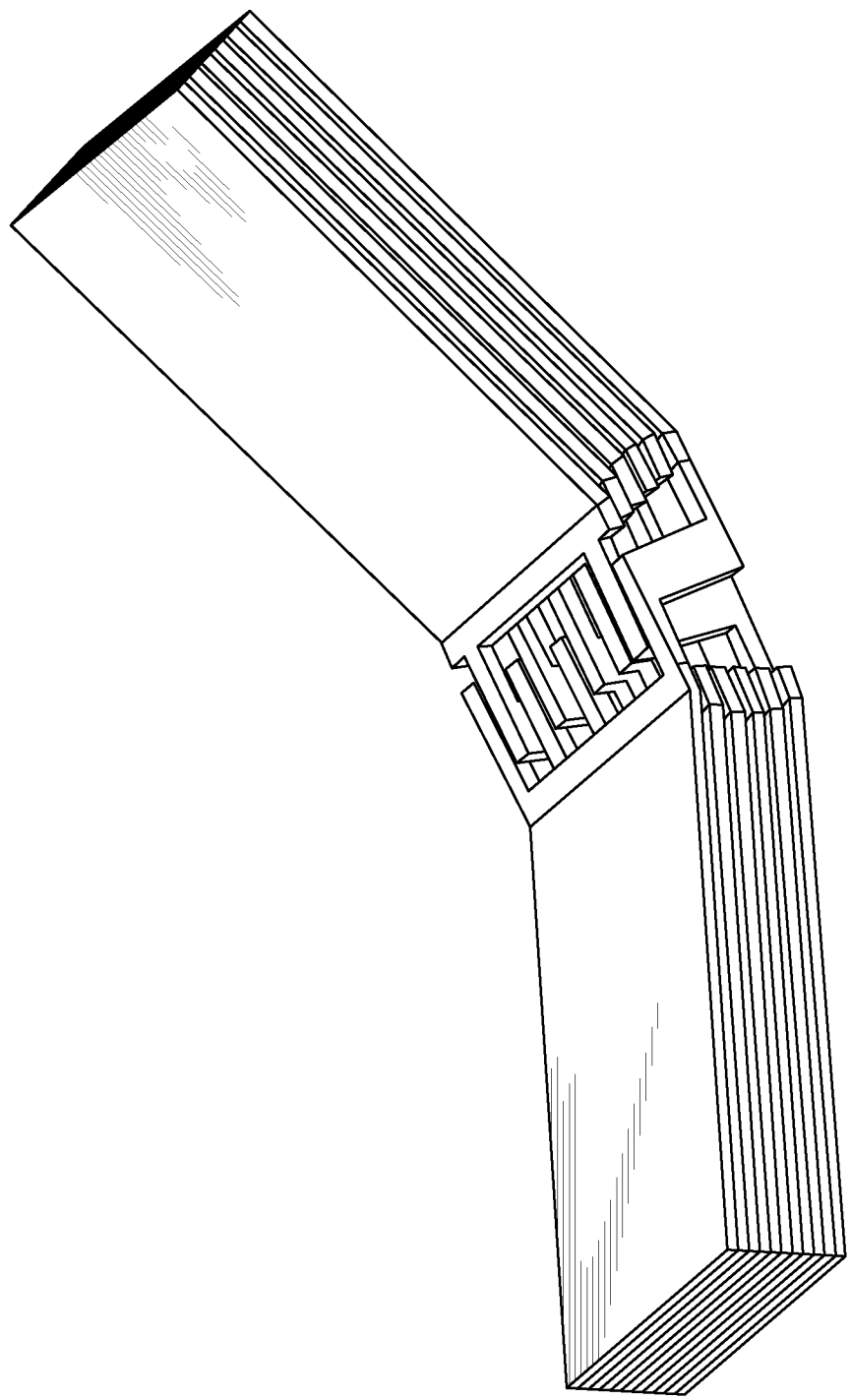
FIG. 22 shows, in schematic perspective view, certain aspects and features of a laminated assembly including a hinge feature prepared according to principles of the invention.

FIG. 21 shows in schematic form, an example of a multilayer joint including three base linkages. FIG. 22 shows in schematic perspective view, an exemplary practical implementation of one embodiment of a multilayer joint.

Figure 23:
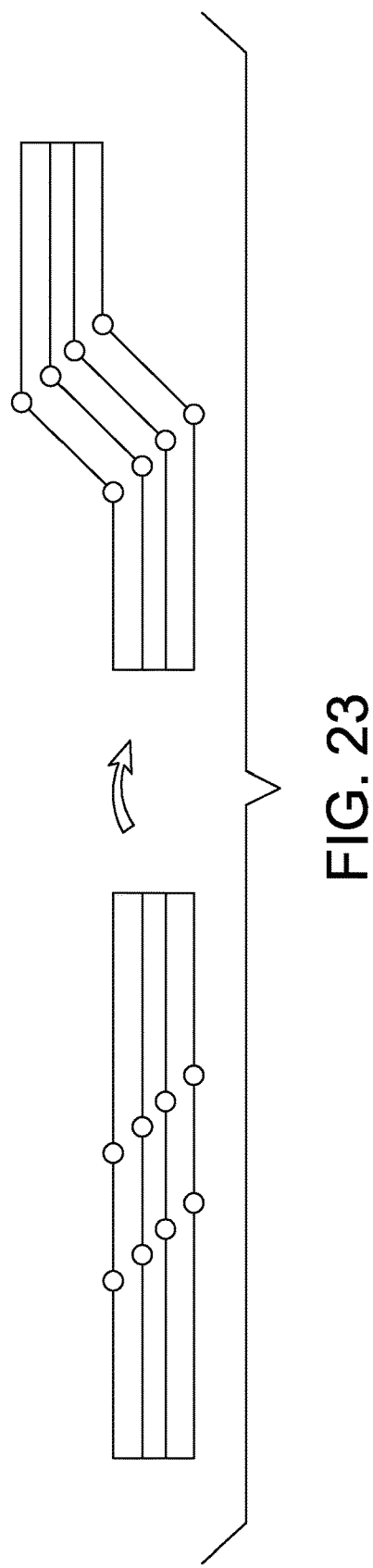
FIG. 23 shows, in schematic diagram form, certain aspects and features of a laminated assembly including a further hinge feature prepared according to principles of the invention.

FIG. 23 shows, in schematic form, a further implementation of a multilayer joint prepared according to principles of the invention. The illustrated multilayer joint is one in which many joint and their associated links combined to create an output link that translates along a circular arc without rotation. Such a design is a useful subcomponent of a larger linkage. Furthermore, it arbitrarily scales to any even number of joints, with larger joint count leading to increased movement precision and increased robustness.

FIG. 23 illustrates a for linkage layer embodiment of this arrangement of joints, involving eight joints. To linkage layers (for joints) are the minimum to ensure 1° of freedom motion. Notably, this design can be extended, without obligation, to an arbitrary number n of linkage layers involving 2n joints. The magnitude of off-axis torque is designed to withstand before failure scales approximately linearly with n, hugely increasing mechanism robustness. Furthermore, this design increases motion precision by connecting multiple linkages in parallel, averaging their output motion.

Figure 24A:
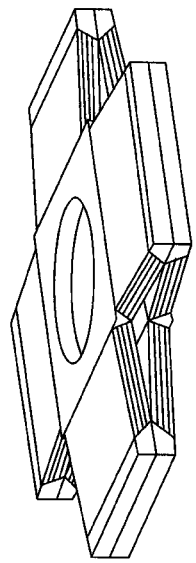
FIGS. 24A, 24B, 24C and 24D show, in schematic perspective view, various operational states of a laminated assembly including a Sarrus hinge feature prepared according to principles of the invention.
Figure 24B:
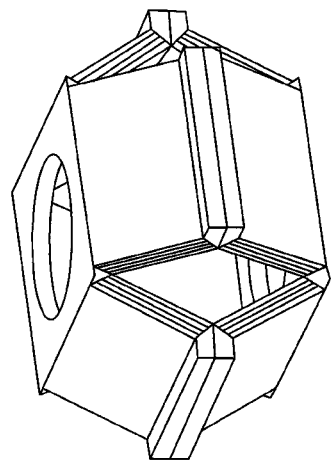
Figure 24C:
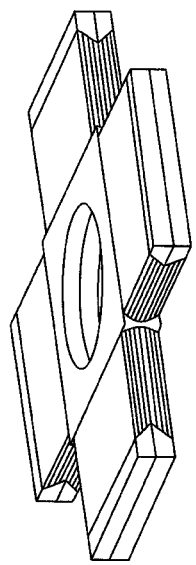
Figure 24D:
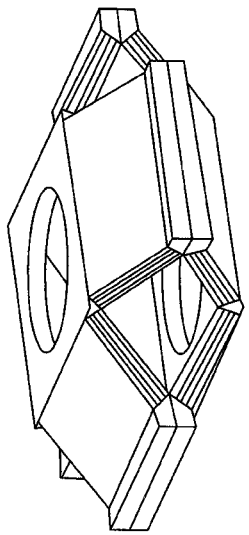

In one specific embodiment, eight instances of this arrangement of joints can be combined to create a larger linkage whose output translates along a straight line without rotation, similar to a Ferris hinge or scissors jack. Such linear motion is useful, e.g., for moving mirrors or lenses in optical systems. Representation of this embodiment is provided in various states of operation in FIGS. 24A-24C.

Figure 25:
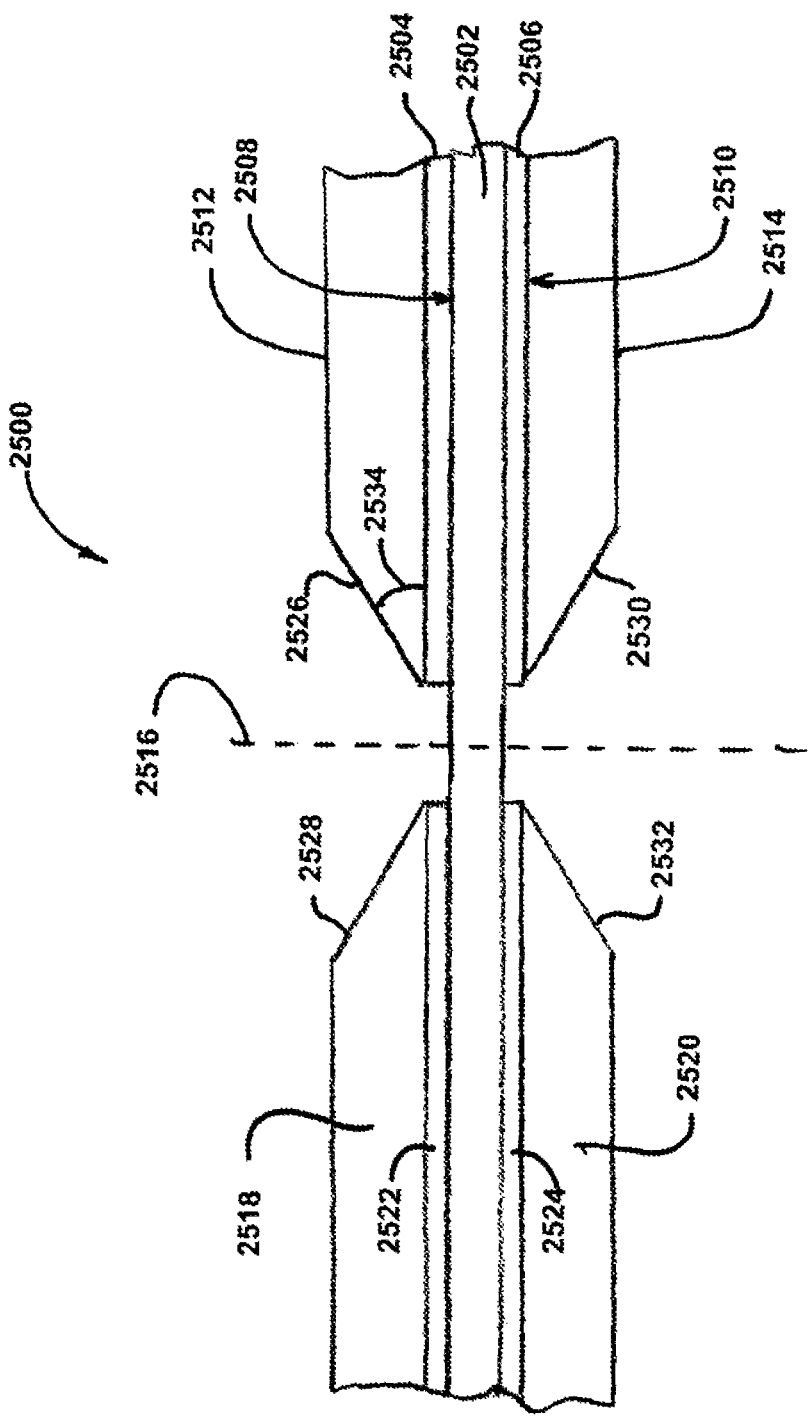
FIG. 25 shows, in cross-section, a further laminated assembly including a relaxed hinge feature prepared according to principles of the invention.

FIG. 25 shows, in cross-sectional view, a further aspect and embodiment of the invention including a portion of a joint 2500. In the exemplary embodiment of FIG. 25 the hinge includes a first substantially flexible layer 2502. First 2504 and second 2506 layers of adhesive material are disposed in intimate contact with respective upper and lower surface regions of the first substantially flexible layer 2502. First 2504 and second 2506 layers of adhesive material are disposed in intimate contact with respect to lower 2508 and upper 2510 surface regions of substantially rigid upper 2512 and lower 2514 layers of material.

As is evident from the figure, the substantially flexible layer 2502 extends across a medial plane 2516 of the joint 2500. Likewise, further portions 2518, 2520 of first 2504 and second 2506 substantially rigid layers are disposed across the medial plane, and coupled to the substantially flexible layer 2502 by respective portions 2522, 2524 of the adhesive layers 2504 and 2506.

As illustrated in FIG. 25, and surfaces 2526, 2528, 2530, 2532 of the substantially rigid layers 2512, 2514 are relieved from the perpendicular at a relief angle, e.g., 2534. For purposes of this description (and without limiting in any way the configuration that an actual joint prepared according to principles of the invention will behave subject to and in the absence of external forces), the configuration of joint 2500 illustrated in FIG. 25 will be denominated the "relaxed" configuration.

Figure 26:
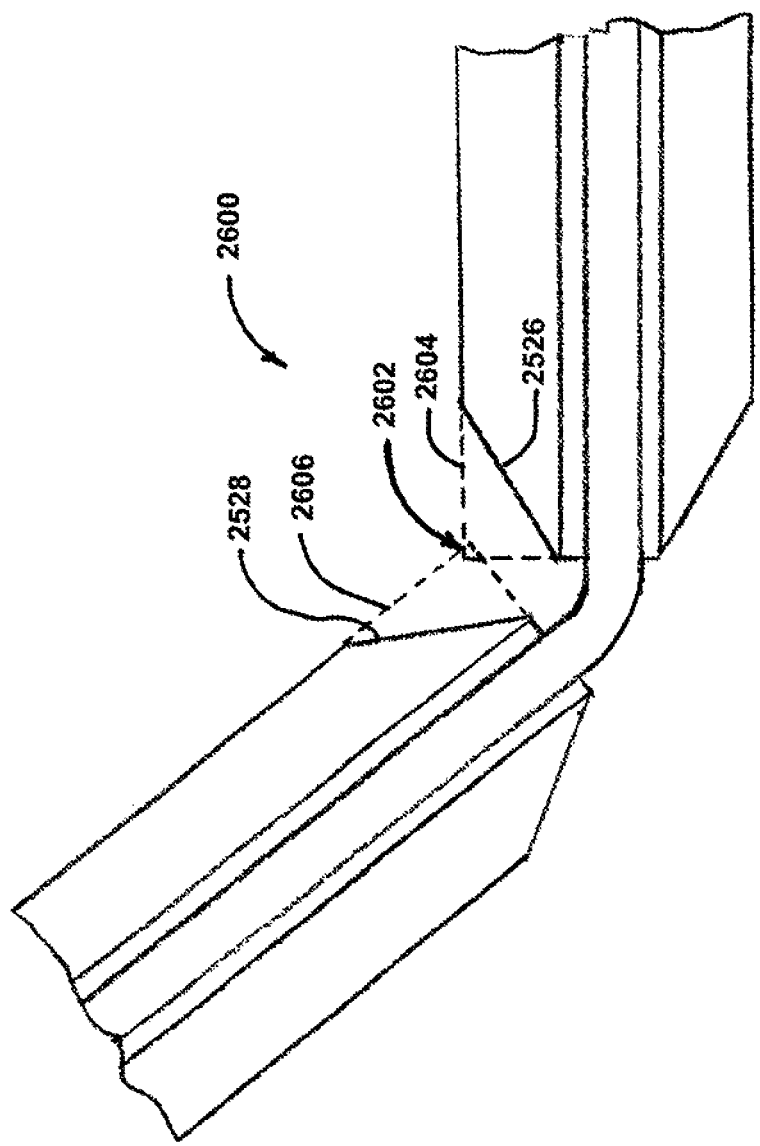
FIG. 26 shows in cross-section, a further portion of a laminated assembly including a flexed hinge feature prepared according to principles of the invention.

FIG. 26 illustrates a joint 2600 that is similar to joint 2500 of FIG. 25. Joint 2600 is shown in a flexed configuration, illustrating one mode of operation of the joint. It will be noted that no mechanical interference is exhibited, by the illustrated configuration, between the relieved surface edges 2526 and 2528. This is in contrast to the mechanical interference that would occur 2602 if the surface edges were not relieved, but were in a perpendicular orientation as illustrated by dashed lines 2604, 2606.

Figure 27:
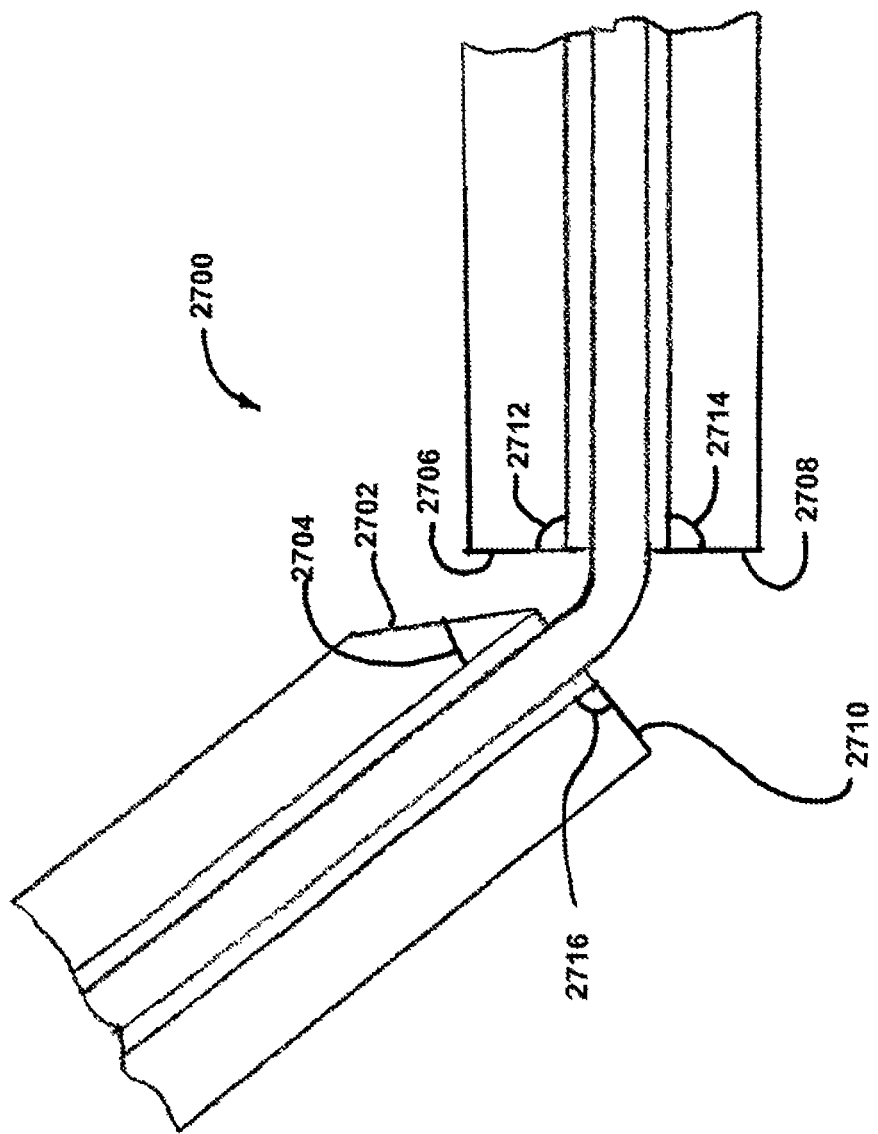
FIG. 27 shows, in cross-section, a portion of a still further laminated assembly including a hinge feature prepared according to principles of the invention.

FIG. 27 illustrates a joint 2700 exemplifying further aspects and embodiments of the invention. As illustrated, joint 2700 includes an edge surface 2702 that is relieved at a relief angle 2704. Other edge surfaces, e.g., 2706, 2708, 2710 are not relieved, or are relieved at other relief angles, e.g. 2712, 2714 and 2716, respectively. Thus it will be appreciated that the relief angles corresponding to a particular edge surface will be chosen in light of the particular circumstances in which the joint is applied. Indeed, in certain embodiments, the edge surfaces will include features allowing interlocking of relief surfaces at the extreme end of a joints activation to provide additional support and/or will include elastic features adapted to cushion the arrival of the joint at such an extreme position.

Figure 28:
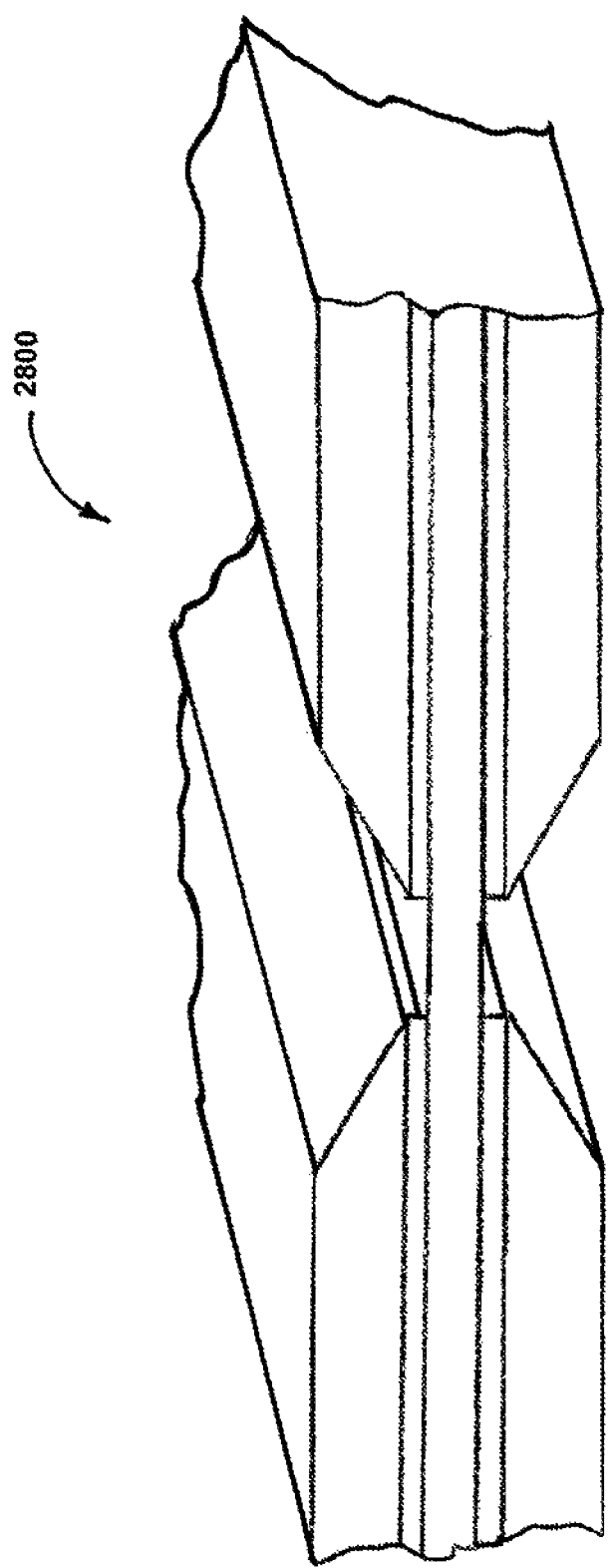
FIG. 28 shows, in perspective view, a further laminated assembly including a relaxed hinge feature prepared according to principles of the invention.

FIG. 28 shows a portion of an exemplary joint 2800 in perspective view so as to further clarify the disclosure.

In preparing the device as described above, layers of metal, composite, polymer, etc., are machined or formed by virtually any method; and virtually any material may be used. Example machining methods include laser cutting from sheet material, photo-chemical etching, punching, electroforming, electric discharge machining, etc.—basically any method that has appropriate resolution and compatibility with the desired material.

Machined layers may then be subjected to additional processes, such as cleaning/etching to remove machining debris, plating (e.g., plating fluxed copper on a layer to facilitate adhesion of solder thereto), preparation for bonding, annealing, etc. The unified nature of each layer makes handling and post-processing easy. Advantageously, each layer can be a different material and can be machined and treated differently from each of the other layers.

Each layer can also advantageously be formed of a material that is sufficiently rigid, strong and tough to allow holes for alignment pins and other features to be machined into the layer, to facilitate easy handling, and to not distort when placed into the layup and when restrained by alignment pins.

In other embodiments, layers that do not have the structural stability to support alignment features can nevertheless be used by attaching such layers, in bulk form, to a rigid frame that meets these objectives without introducing enough additional thickness to disturb the other layers or parts in the laminate.

In particular examples, a very thin polymer film (e.g., 2-5 microns thick) is included among the layers. Due to its thinness and insulating qualities, the thin polymer film is prone to wrinkling and electrostatic handling issues. To address this tendency, the thin polymer film can be lightly stretched, in bulk form, to a flat and controlled state and then bonded to a thin frame that is made, for example, of thin metal or fiberglass composite. Next, the thin polymer layer can be machined with the fine part features (e.g., tiny holes in the polymer at precise locations), and the alignment hole features can be machined into the frame material.

In additional embodiments, the device can be designed to mitigate thin-layer handling issues. For example, a part within the device can be designed such that all machining pertinent to a fragile layer is performed post-lamination; and, thus, this layer will not require precision alignment when put into the laminate, though the material is advantageously capable of being placed into the laminate sufficiently flat and extending over a sufficient area to cover the desired parts of the device.

In exemplary embodiments, bulk polymer films (formed, e.g., of polyester, polyimide, etc.); metal sheets and foils [formed, e.g., of stainless steel, spring steel, titanium, copper, invar (FeNi36), nickel-titanium alloy (nitinol), aluminum, etc.]; copper-clad laminates; carbon fiber and glass fiber composites; thermoplastic or thermoset adhesive films; ceramic sheets; etc.; can be laser machined to make the layers that are laminated to form the multi-layer structure. The laser machining can be performed, e.g., with a 355-nm laser (from DPSS Lasers Inc. of Santa Clara, Calif.) with a spot size of about 7 microns on materials with typical thicknesses of 1-150-μm, although thicker layers can be machined with such a laser, well. Accordingly, this type of laser allows for very high resolution and an ability to machine almost any type of material.

Adhesion between layers is achieved by patterning adhesive onto one or both sides of a non-adhesive layer or by using free-standing adhesive layers ("bondplies"). In the latter case, an intrinsically adhesive layer, e.g., in the form of a sheet of thermoplastic or thermoset film adhesive, or an adhesive laminate, such as a structural material layer with adhesive pre-bonded to one or both sides.

The adhesive layer is machined like the other layers. Specific examples of sheets that can be used as the adhesive layer 14 include sheet adhesives used in making flex circuits (e.g., DuPont FR1500 adhesive sheet) or polyimide film coated with FEP thermoplastic adhesive on one or both sides.

Free-standing sheet adhesives can be acrylic-based for thermosets; alternatively, the adhesive can be thermoplastic, wherein the thermoplastic film can be formed of polyester, fluorinated ethylene propylene (or other fluoropolymer), polyamide, polyetheretherketone, liquid crystal polymer, thermoplastic polyimide, etc. Any of these adhesives can also be applied on one or both sides to a non-adhesive carrier. In additional embodiments, a layer may serve both as a structural layer and as a thermoset adhesive—for example, liquid crystal polymer or thermoplastic polyimide. Furthermore, for special types of structural layers, a variety of wafer bonding techniques that do not require an adhesive may be employed, such as fusion bonding.

In another technique for achieving adhesion between layers, adhesive is applied and patterned directly on a non-adhesive layer. This technique can be used where, for example, the type of adhesive desired may not be amenable to free-standing form. Examples of such an adhesive include solders, which are inherently inclined to form a very thin layer, or adhesives that are applied in liquid form (by spraying, stenciling, dipping, spin coating, etc.) and then b-stage cured and patterned. B-staged epoxy films are commonly available, but they usually cannot support themselves unless they are quite thick or reinforced with scrim.

The resulting bond can be a "tack bond," wherein the adhesive 14 is lightly cross-linked to an adjacent layer before laser micromachining with sufficient tack to hold it in place for subsequent machining and with sufficient strength to allow removal of the adhesive backing layer. The tack bonding allows for creation of an "island" of adhesive in a press layup that is not part of a contiguous piece, which offers a significant increase in capability.

Another reason for tacking the adhesive to an adjacent structural layer is to allow for unsupported "islands" of adhesive to be attached to another layer without having to establish a physical link from that desired adhesive patch to the surrounding "frame" of material containing the alignment features. In one embodiment, a photoimagable liquid adhesive, such as benzocyclobutene, can be applied in a thin layer, soft baked, and then patterned using lithography, leaving a selective pattern of adhesive. Other photoimagable adhesives used in wafer bonding can also be used.

The adhesive is patterned while initially tacked to its carrier film, aligned to the structural layer using pins, and then tacked to at least one adjoining layer in the layup with heat and pressure (e.g., at 200° C. and 340 kPa for one hour). Alternatively, the adhesively layer can be patterned by micro-machining it as a free sheet.

Tack bonding can involve application of heat and pressure at a lower intensity and for less time than is required for a complete bond of the adhesive. In yet another embodiment, the adhesive film can be tack bonded in bulk, and then machined using, for example, laser skiving/etching. Advantageously, use of this variation can be limited to contexts where the machining process does not damage the host layer. Both of these variations were tried using DuPont FR1500 adhesive sheet and laser skiving.

To form the multi-layer laminate structure, a multitude of these layers (e.g., up to 15 layers have been demonstrated) are ultrasonically cleaned and exposed to an oxygen plasma to promote bonding and aligned in a stack by passing several vertically oriented precision dowel pins respectively through several alignment apertures in each of the layers, and by using a set of flat tooling plates with matching relief holes for the alignment pins. In other embodiments, other alignment techniques (e.g., optical alignment) can be used.

All layers can be aligned and laminated together. Linkages in the laminated layers can be planar (where all joint axes are parallel); or the joint axes can be non-parallel, allowing for non-planar linkages, such as spherical joints. In the fifteen-layer example, the final layup included the following layers, which formed a pair of linkages (i.e., structures wherein flexible layers are bonded to rigid segments and extend across the gaps between the rigid segments, thereby enabling flexure of the rigid segments relative to one another at the flexible layer in the gaps between the rigid segments, wherein those exposed sections of the flexible layer effectively serve as joints.

Unless otherwise defined, used or characterized herein, terms that are used in this description (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "upper," "beneath," "below," "lower," and the like, may be used herein for ease of description to describe the relationship of one element to another element, as illustrated in the figures. It will be understood that the spatially relative terms are intended to encompass different orientations of the apparatus in use or operation in addition to the orientation described and/or depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, the singular forms, "a," "an" and "the," are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

In presenting the descriptions above, reference has been made to be "super-planar structure." By "planar," we mean a layer or plane that can be distorted, flexed or folded (these terms may be used interchangeably herein). An embodiment of this structure can be achieved, for example, by forming a five-layer composite with the following sequence of layers: rigid layer, adhesive layer, flexible layer, adhesive layer, rigid layer. Alternatively, a thinner composite can be formed from a stacking of just a rigid layer, an adhesive layer, and a flexible layer, though this structure is not symmetric. The rigid layers are machined to have gaps that correspond to fold lines, while the flexible layer is continuous, thereby providing a joint where the flexible layer extends across the gaps machined from the rigid layers.

Characterization of the structure as being "super-planar" means taking multiple planar layers and selectively connecting them. An analogy here can be drawn to circuit boards, where electrical vias connect circuits on different layers. Here, in contrast, the structure is made with "mechanical vias." By stacking multiple planar layers, the range of achievable devices is greatly expanded. The super-planar structure also enables features and components to be packed into the structure that would not fit if the device could only be made out of one planar sheet. Advantageously, super-planar structures with mechanisms that operate normal to the plane can now be made with these techniques. In practice, forming Sarrus linkages between planar layers is an advantageous strategy for designing an assembly mechanism/ scaffold. Other mechanisms can attach to the Sarrus links to effect the intended component rotations.

The multi-layer super-planar structure can be fabricated via the following sequence of steps: (1) machine each planar layer, (2) machine or pattern adhesives, (3) stack and laminate the layers under conditions to effect bonding, (4) post-lamination machining of the multi-layer structure, (5) post-lamination treatment of the multi-layer structure, (6) freeing an assembly degree of freedom in each structure, (7) locking connections between structural members, (8) freeing any non-assembly degrees of freedom, and (9) separating finished parts from a scrap frame.

While the exemplary embodiments described above have been chosen primarily from the field of assemblies of generally planar elements, one of skill in the art will appreciate that the principles of the invention are equally well applied, and that the benefits of the present invention are equally well realized in relation to elements of other configurations including, for example, elements having a cylindrical, ellipsoid or hemispherical curvature. Further, while the invention has been described in detail in connection with the presently preferred embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the invention. Accordingly, the invention is not to be seen as limited by the foregoing description, but is only limited by the scope of the appended claims.

The invention claimed is:

1. A PC MEMS clamped joint comprising:
   first and second members, each of said first and second members including a respective layer of substantially rigid material and having respective first and second substantially planar surface regions, said first and second surface regions being disposed facing one another in substantially parallel spaced relation to define a first spatial region therebetween, said first and second members having respective third and fourth substantially parallel surface regions, said third and fourth surface regions being disposed facing one another in substantially parallel spaced relation to define a second spatial region therebetween, said first and second members having respective first and second terminal end surface regions;
   a third member disposed between said first and second members, said third member including a layer of generally flexible material, said third member being disposed within both said first and second spatial regions, said third member having a fifth surface region disposed in substantially parallel spaced relation to said first surface region and a sixth surface region disposed in substantially parallel spaced relation to said second surface region, said third member having a seventh surface region disposed in close proximity to said third surface region and an eighth surface region disposed in close proximity to said fourth surface region, an adhesive material disposed between said first and fifth surface regions and between said second and sixth surface regions, wherein said third member extends outwardly of said first and second terminal end surface regions, and wherein a distance between said first surface region and said fifth surface region is substantially larger than a distance between said third surface region and said seventh surface region.

2. A PC mems clamped joint as defined in claim 1 further comprising an adhesive material disposed between said third surface region and said seventh surface region.

3. A PC mems clamped joint as defined in claim 1 wherein a distance between said third surface region and said seventh surface region is substantially equal to zero.

4. A PC mems clamped joint as defined in claim 1 wherein a further surface region disposed between said first surface region and said third surface region includes a dihedral angle.

5. A PC mems clamped joint as defined in claim 4 wherein said dihedral angle comprises an angle substantially equal to 90°.

6. A PC mems clamped joint as defined in claim 4 wherein said dihedral angle comprises an oblique angle.

7. A PC mems clamped joint as defined in claim 4 wherein said first member comprises a deformed region disposed between said first surface region and said third surface region.

8. A PC mems clamped joint as defined in claim 1 wherein said third member includes an aperture disposed between said third and fourth surface regions.

9. A PC mems clamped joint as defined in claim 8 wherein an adhesive material is disposed within said aperture, said adhesive material being disposed in contact with said third and fourth surface regions.

10. A PC mems clamped joint as defined in claim 1 wherein said third member includes an aperture disposed through said third member in a region between said first surface region and said third surface region.

11. A PC mems clamped joint as defined in claim 10 wherein an adhesive material is disposed within said aperture, said adhesive material being disposed in contact with respective surface regions of said first and second members.

12. A PC mems clamped joint as defined in claim 1 wherein said layer of generally flexible material comprises a plurality of sheets of generally flexible material.

13. A PC mems joint as defined in claim 12 wherein respective portions of said plurality of sheets of generally flexible material are adapted to slide against one another in shear.

14. A PC mems clamped joint as defined in claim 12 wherein said layer of generally flexible material further comprises an adhesive material disposed between at least a first sheet and a second sheet of said plurality of sheets of generally flexible material.

15. A PC mems clamped joint as defined in claim 1 wherein said first member further includes a further layer of substantially rigid material, said third surface region being a surface region of said further layer of substantially rigid material.

16. A PC mems clamped joint as defined in claim 15 wherein said first member includes an adhesive material disposed between said first layer of substantially rigid material and said further layer of substantially rigid material.

17. A PC mems clamped joint as defined in claim 1 wherein said first terminal end surface region is disposed substantially normal to a plane of said third surface region.

18. A PC mems clamped joint as defined in claim 1 wherein said second terminal end surface region is disposed substantially normal to a plane of said fourth surface region.

* * * * *

UNITED STATES PATENT AND TRADEMARK OFFICE
CERTIFICATE OF CORRECTION

PATENT NO. : 10,349,543 B2  
APPLICATION NO. : 14/834336  
DATED : July 9, 2019  
INVENTOR(S) : Pratheev Sabaratnam Sreetharan and Andrew Baisch Page 1 of 1

It is certified that error appears in the above-identified patent and that said Letters Patent is hereby corrected as shown below:

On the Title Page

Item (71) should read Applicants: VIBRANT COMPSITES, INC., Cambridge, MA;

Signed and Sealed this  
Third Day of September, 2019

Andrei Iancu  
*Director of the United States Patent and Trademark Office*